(12) United States Patent
Yoon et al.

(10) Patent No.: US 11,812,607 B2
(45) Date of Patent: Nov. 7, 2023

(54) SEMICONDUCTOR DEVICES INCLUDING A LINER AND METHOD OF MANUFACTURING THE SAME

(71) Applicant: Samsung Electronics Co., Ltd., Suwon-si (KR)

(72) Inventors: Sungmi Yoon, Seoul (KR); Donghyun Im, Suwon-si (KR); Jooyub Kim, Seoul (KR); Juhyung We, Hwaseong-si (KR); Namhoon Lee, Hwaseong-si (KR); Chunhyung Chung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/685,794

(22) Filed: Mar. 3, 2022

(65) Prior Publication Data
US 2022/0189963 A1  Jun. 16, 2022

Related U.S. Application Data

(62) Division of application No. 16/850,223, filed on Apr. 16, 2020, now Pat. No. 11,296,089.

(30) Foreign Application Priority Data

Sep. 24, 2019 (KR) .......................... 10-2019-0117246

(51) Int. Cl.
*H01L 21/768* (2006.01)
*H10B 12/00* (2023.01)
(Continued)

(52) U.S. Cl.
CPC ....... *H10B 12/34* (2023.02); *H01L 21/76224* (2013.01); *H01L 21/76829* (2013.01);
(Continued)

(58) Field of Classification Search
CPC ......... H01L 21/76224; H01L 21/76829; H01L 21/76831; H01L 21/76832; H01L 29/0642;
(Continued)

(56) References Cited

U.S. PATENT DOCUMENTS 5,801,082 A   9/1998 Tseng
7,468,311 B2  12/2008 Dip et al.
(Continued)

FOREIGN PATENT DOCUMENTS

JP    20080171958 A   7/2008
KR    101078101 B1   10/2011
(Continued)

OTHER PUBLICATIONS

Cheung; Thermal Oxidation of Si, EE143 Lecture #5; Published In: http://www.eng.tau.ac.il/~yosish/courses/vlsi1/l-4-1-Oxidation.pdf; Date of Publication: Jan. 21, 2015; Slide 5 (Year: 2015).*
(Continued)

*Primary Examiner* — Phat X Cao
*Assistant Examiner* — William Henry Anderson
(74) *Attorney, Agent, or Firm* — Harness, Dickey & Pierce, P.L.C.

(57) ABSTRACT

A semiconductor device may include active pattern, a silicon liner, an insulation layer, an isolation pattern and a transistor. The active pattern may protrude from a substrate. The silicon liner having a crystalline structure may be formed conformally on surfaces of the active pattern and the substrate. The insulation layer may be formed on the silicon liner. The isolation pattern may be formed on the insulation layer to fill a trench adjacent to the active pattern. The transistor may include a gate structure and impurity regions. The gate structure may be disposed on the silicon liner, and
(Continued)

the impurity regions may be formed at the silicon liner and the active pattern adjacent to both sides of the gate structure.

15 Claims, 23 Drawing Sheets

(51) Int. Cl.
 *H01L 21/762* (2006.01)
 *H01L 29/06* (2006.01)

(52) U.S. Cl.
 CPC ....... *H01L 29/0653* (2013.01); *H10B 12/053* (2023.02); *H10B 12/315* (2023.02)

(58) Field of Classification Search
 CPC .............. H01L 29/0649; H01L 29/0653; H01L 27/108; H01L 27/10805; H01L 27/10823; H01L 27/10873; H01L 27/10876; H10B 12/30; H10B 12/34; H10B 12/05; H10B 12/053
 See application file for complete search history.

(56) References Cited

U.S. PATENT DOCUMENTS

| | | |
|---|---|---|
| 7,811,907 B2 | 10/2010 | Shibata et al. |
| 7,863,163 B2 | 1/2011 | Bauer |
| 8,360,001 B2 | 1/2013 | Todd et al. |
| 8,394,196 B2 | 3/2013 | Kim |
| 8,673,706 B2 | 3/2014 | Ramaswamy et al. |
| 8,759,200 B2 | 6/2014 | Francis et al. |
| 9,257,305 B2 | 2/2016 | Lee |
| 9,530,638 B2 | 12/2016 | Dube et al. |
| 9,653,584 B2 | 5/2017 | Glass et al. |
| 9,797,067 B2 | 10/2017 | Suzuki et al. |
| 10,249,490 B2 | 4/2019 | Goel et al. |
| 2006/0156970 A1 | 7/2006 | Dong-Suk et al. |
| 2007/0123051 A1* | 5/2007 | Arghavani .............. H01L 22/20 438/692 |
| 2011/0053327 A1* | 3/2011 | Yoon ................ H01L 21/02238 257/E21.546 |
| 2013/0164907 A1* | 6/2013 | Lee ....................... H01L 21/763 438/488 |
| 2015/0079799 A1* | 3/2015 | Nemani ............ H01J 37/32082 438/714 |
| 2016/0087035 A1 | 3/2016 | Kim et al. |
| 2017/0018552 A1 | 1/2017 | Moon et al. |
| 2018/0158828 A1* | 6/2018 | Han .................. H01L 21/76804 |
| 2019/0296025 A1* | 9/2019 | Yoon ..................... H10B 12/053 |
| 2019/0326297 A1 | 10/2019 | Ujihara et al. |
| 2020/0075730 A1* | 3/2020 | Lee ....................... H01L 29/408 |
| 2020/0161171 A1* | 5/2020 | Colombeau ....... H01L 21/02057 |

FOREIGN PATENT DOCUMENTS

| | | | | |
|---|---|---|---|---|
| KR | 20200145974 A | * | 12/2020 | ........... H01L 21/763 |
| KR | 20210039451 A | * | 4/2021 | ......... C23C 16/4401 |

OTHER PUBLICATIONS

Im, KR-20200145974-A, Dec. 2020, translation (Year: 2020).*
Tsuyoshi, KR-20210039451-A, Apr. 2021, translation (Year: 2021).*
Notice of Allowance dated Dec. 1, 2022 corresponding to U.S. Appl. No. 16/850,223.

* cited by examiner

SEMICONDUCTOR DEVICES INCLUDING A LINER AND METHOD OF MANUFACTURING THE SAME

CROSS-REFERENCE TO RELATED APPLICATION

This application is a Divisional of U.S. application Ser. No. 16/850,223, filed Apr. 16, 2020, which claims priority under 35 USC § 119 to Korean Patent Application No. 10-2019-0117246, filed on Sep. 24, 2019, in the Korean Intellectual Property Office (KIPO), the contents of which are incorporated by reference herein in their entirety.

BACKGROUND

1. Field

Example embodiments relate to semiconductor devices and methods of manufacturing the same. More particularly, example embodiments relate to semiconductor devices including an active pattern and a method of manufacturing the same.

2. Description of the Related Art

Recently, as semiconductor devices become highly integrated, it may be beneficial to decrease an area of an upper surface of each of active patterns. Further, a distance between the active patterns may be decreased. Each of the active patterns should have little or no defects, and have a sufficient area for forming transistors and contact plugs.

SUMMARY

Example embodiments provide methods of manufacturing a semiconductor device having excellent characteristics.

Example embodiments provide a semiconductor device.

According to example embodiments, there is provided a semiconductor device that may include an active pattern, a silicon liner, an insulation layer, an isolation pattern and a transistor. The active pattern may protrude from a substrate. The silicon liner having a crystalline structure may be conformally on surfaces of the active pattern and the substrate. The insulation layer may be formed on the silicon liner. The isolation pattern may be formed on the insulation layer to fill a trench adjacent to the active pattern. The transistor may include a gate structure and impurity regions. The gate structure may be on the silicon liner, and the impurity regions may be at the silicon liner adjacent to both sides of the gate structure and at the active pattern adjacent to both sides of the gate structure.

According to example embodiments, there is provided a semiconductor device that may include an active pattern, a silicon liner, an isolation pattern, a transistor, a first insulating interlayer, first and second contact plugs, a bit line and a capacitor. The active pattern may protrude from the substrate. The silicon liner having a crystalline structure may be formed on the active pattern and the substrate. The silicon liner may cover surfaces of the active pattern and the substrate. The isolation pattern may on the silicon liner filling a trench adjacent to the active pattern. The transistor may include a gate structure and first and second impurity regions. The gate structure may be on the silicon liner, and the first impurity region is at the silicon liner adjacent to a first side of the gate structure, and at the active pattern adjacent to the first of the gate structure, and the second impurity region is at the silicon liner adjacent to a second side of the gate structure, and at the active pattern adjacent to the second of the gate structure. The first insulating interlayer may cover the silicon liner, the isolation pattern and the gate structure. The first and second contact plugs may pass through the first insulating interlayer to contact the first and second impurity regions, respectively. The bit line may be electrically connected to the first contact plug. The capacitor may be electrically connected to the second contact plug.

According to example embodiments, there is provided a semiconductor device that may include active pattern, a silicon liner, an insulation layer, a stop layer pattern, an isolation pattern and a transistor. The active pattern may protrude from the substrate. The silicon liner having a crystalline structure may be conformally on surfaces of the active pattern and the substrate. The insulation layer may be on the silicon liner. The stop layer pattern may be on the insulation layer. The stop layer pattern may be in a trench adjacent to the active pattern. The isolation layer pattern may be formed on the stop layer pattern to fill the trench. The transistor may include a gate structure and impurity regions. The gate structure may be on the silicon liner, and the impurity regions may be at the silicon liner adjacent to both sides of the gate structure and at the active pattern adjacent to both sides of the gate structure.

According to example embodiments, there is provided a method of manufacturing a semiconductor device. In the method, a portion of a substrate may be etched to form active pattern protruding from the substrate. A first silicon liner having a crystalline structure may be conformally formed on surfaces of the active pattern and the substrate. A surface of the first silicon liner may be oxidized to form a second silicon liner and an insulation layer on the second silicon liner. The second silicon liner may have a thickness less than a thickness of the first silicon liner. An isolation layer may be formed on the insulation layer to fill a trench adjacent to the active pattern. A transistor including a gate structure and impurity regions may be formed. The gate structure may be disposed on the second silicon liner, and the impurity regions may be formed at the second silicon liner adjacent to both sides of the gate structure and at the active pattern adjacent to both sides of the gate structure.

As described above, in accordance with example embodiments, the active structure may include the first active pattern formed by etching the substrate and the liner layer having a crystalline structure. Further, the insulation layer may be formed on the liner layer having a crystalline structure. The liner layer having a crystalline structure may have excellent surface roughness, and may not include defects. Therefore, the semiconductor device formed on the active structure may have high performance. Further, as the area of the upper surface of the first active pattern is not reduced, transistors and contact plugs may be easily formed on the active structure.

BRIEF DESCRIPTION OF THE DRAWINGS

Example embodiments will be more clearly understood from the following detailed description taken in conjunction with the accompanying drawings.

FIGS. 1 to 10 and FIGS. 12 to 24 are cross-sectional views, plan views and perspective views illustrating a vertical semiconductor device in accordance with example embodiments;

FIG. 11 is an apparatus used to manufacture the semiconductor device;

FIGS. 25 to 27 are plan views and perspective views illustrating stages of a method of manufacturing a semiconductor device in accordance with example embodiments;

FIGS. 28 to 30 are a plan view and perspective views illustrating stages of a method of manufacturing a semiconductor device in accordance with example embodiments;

FIGS. 31 to 35 are cross-sectional views illustrating stages of a method of manufacturing a semiconductor device in accordance with example embodiments; and FIGS. 36 and 37 are cross-sectional views illustrating stages of a method of manufacturing a semiconductor device in accordance with example embodiments.

DESCRIPTION OF EMBODIMENTS

Example embodiments will be more clearly understood from the following detailed description taken in conjunction with the accompanying drawings.

Hereinafter, two directions substantially parallel to an upper surface of the substrate and crossing each other are defined as a first direction and a second direction, respectively. The first and second directions are substantially perpendicular to each other. An oblique direction with respect to the first direction is defined as a third direction, and a direction perpendicular to the third direction is defined as a fourth direction. The third and fourth directions substantially parallel to the upper surface of the substrate.

Figure 11:
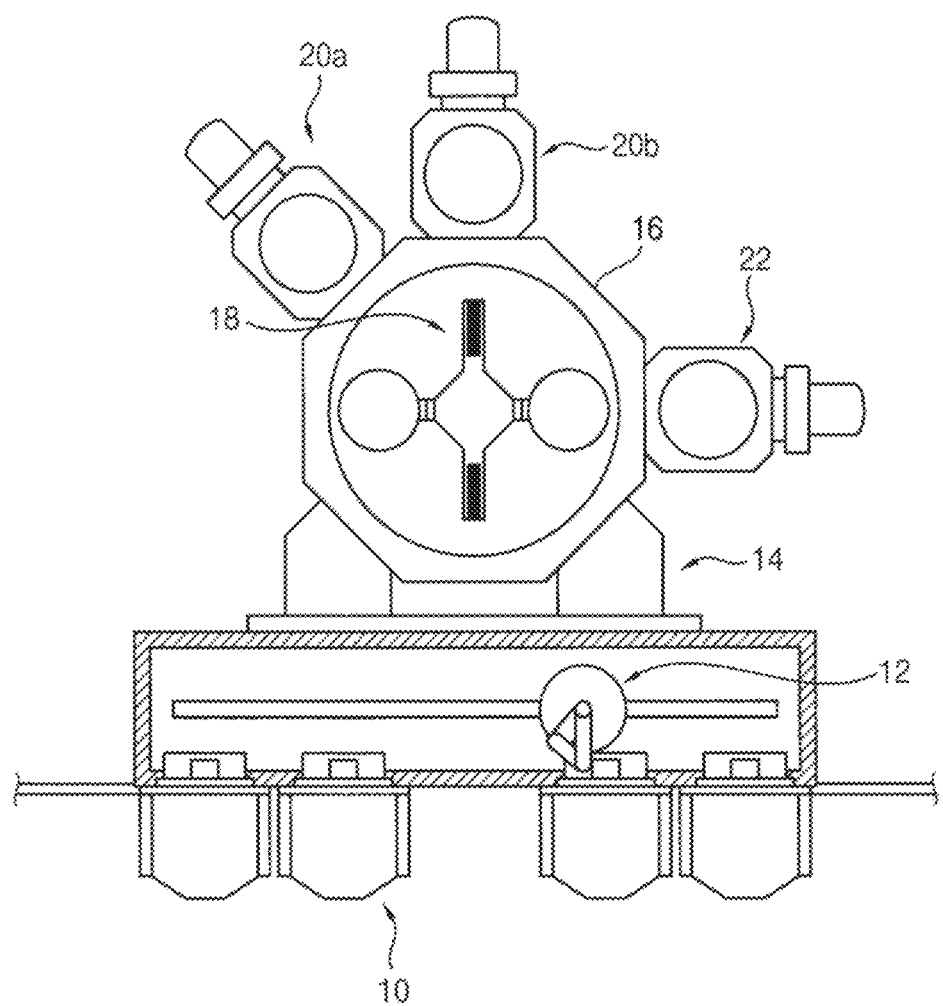
Figure 12:
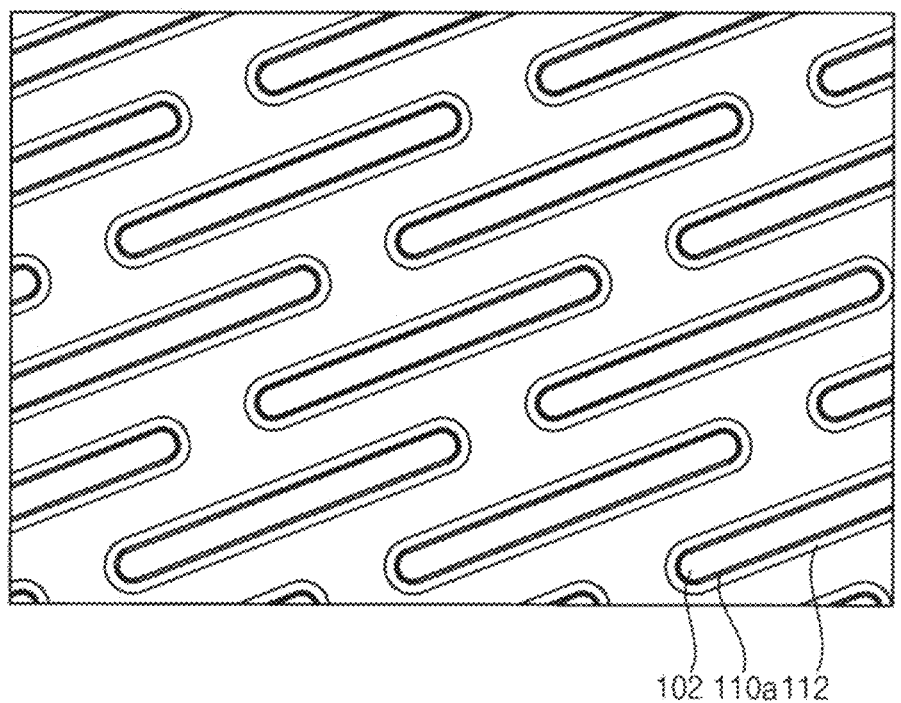
Figure 13:
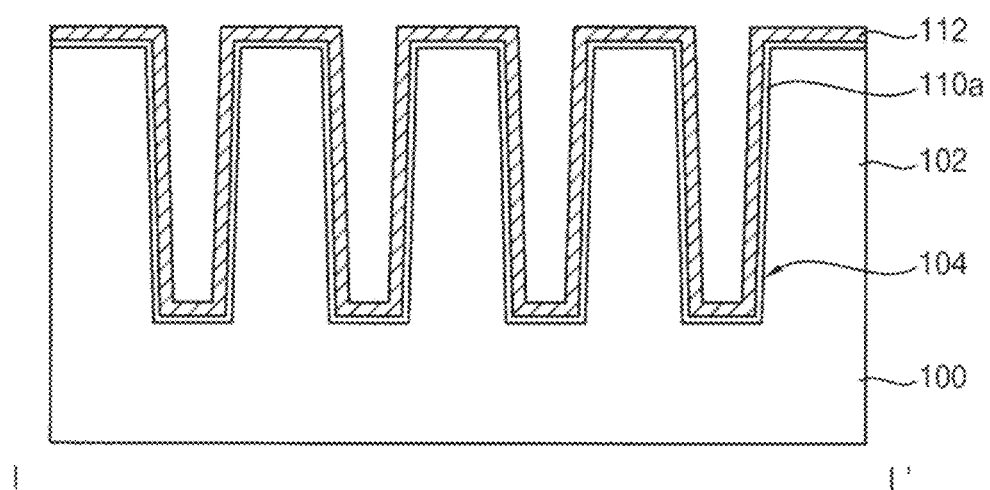
Figure 14:
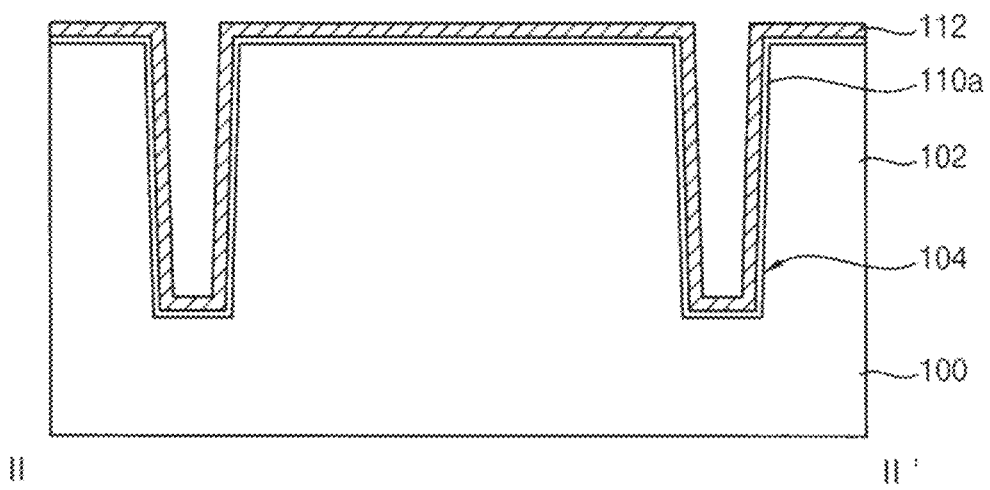
Figure 15:
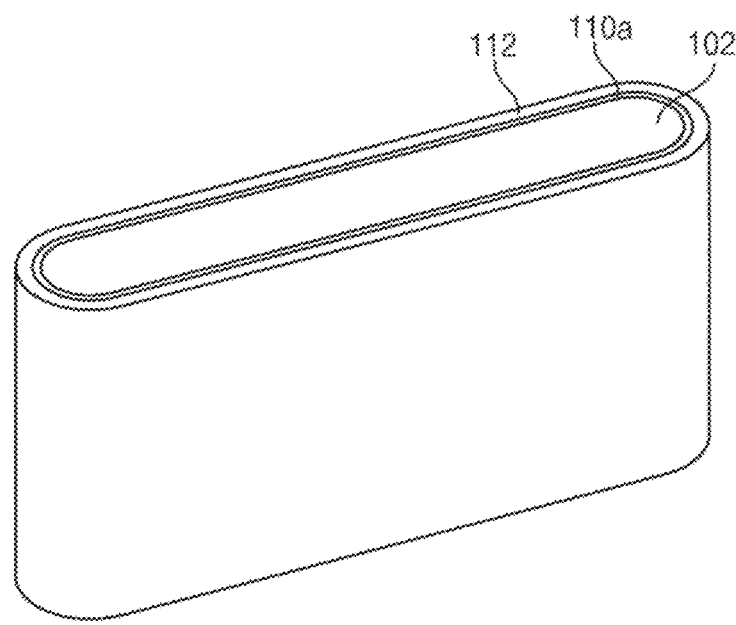

FIGS. 1 to 10 and FIGS. 12 to 24 are cross-sectional views, plan views and perspective views illustrating a vertical semiconductor device in accordance with example embodiments. FIG. 11 is an apparatus used to manufacture the semiconductor device.

Particularly, FIGS. 1, 7, 12 and 23 are plan views. FIGS. 2 to 5, 8 to 10, 13, 14, 16 to 19, 21, 22 and 24 are cross-sectional views, and FIGS. 6, 10, 15 and 20 are perspective views. FIGS. 2, 4, 8, 13, 16 and 18 are cross-sectional views taken along the line I-I' of FIG. 1. FIGS. 3, 5, 9, 14, 17, 19, 21 and 24 are cross-sectional views taken along the line II-II' of FIG. 1. FIG. 22 is a cross-sectional views taken along the line III-III' of FIG. 1. Each of the perspective views only illustrates the layers formed on the sidewalls of one of the active patterns.

The semiconductor device may include a dynamic random-access memory (DRAM) device.

Figure 1:
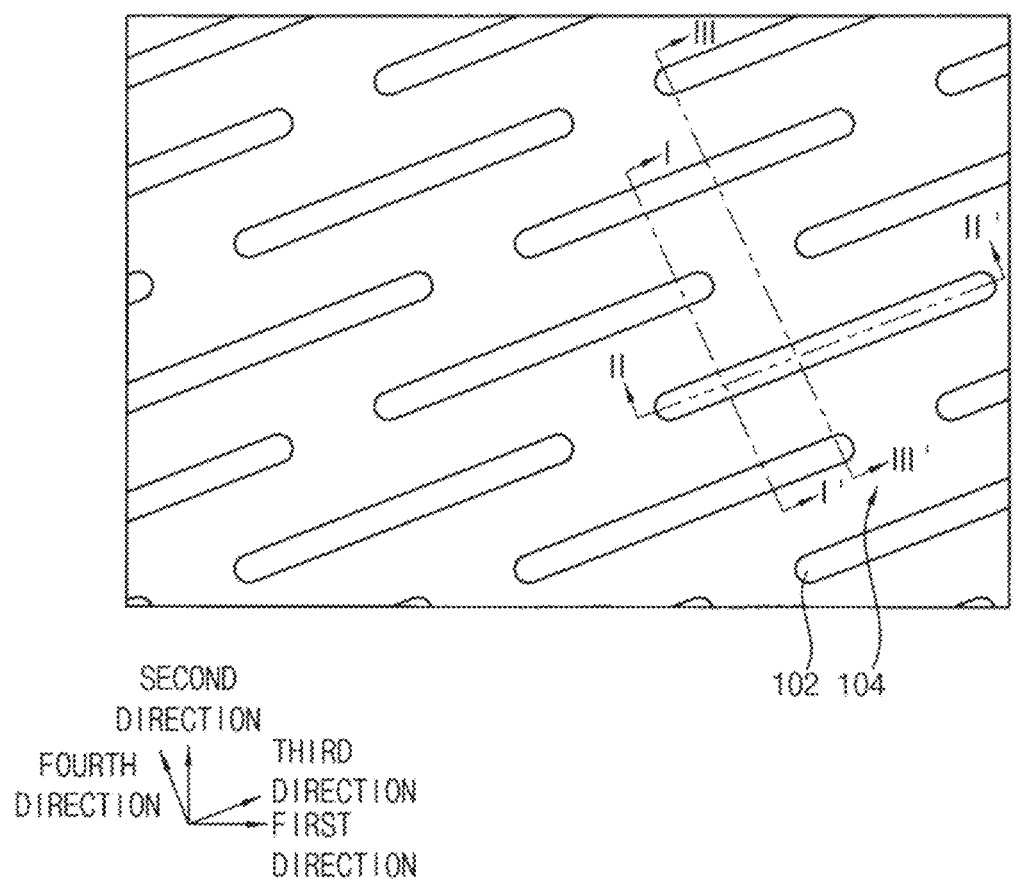
FIGS. 1 to 37 represent non-limiting, example embodiments as described herein.
Figure 2:
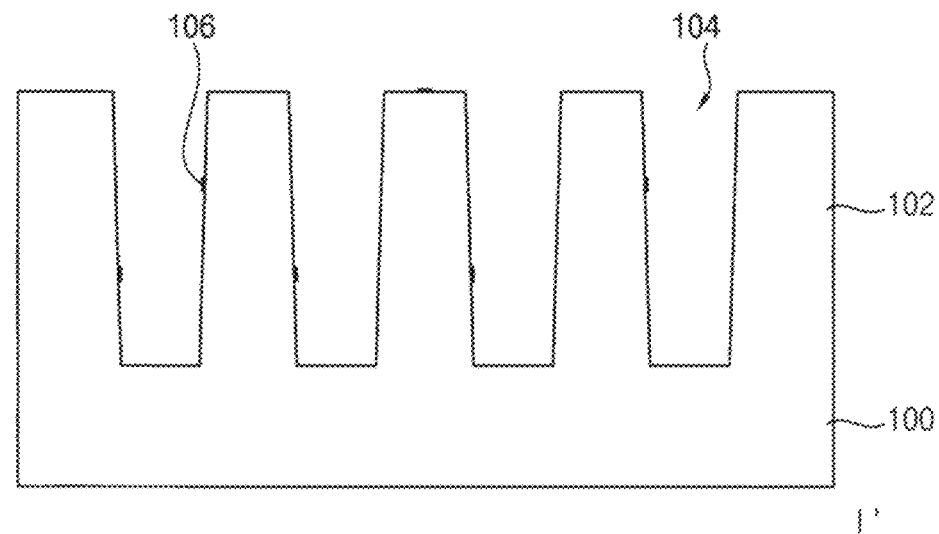
Figure 3:
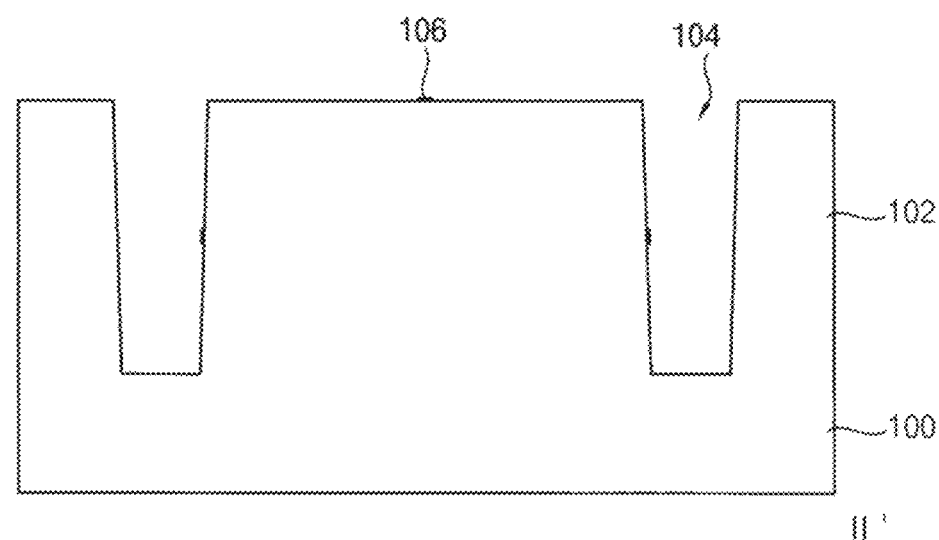

Referring to FIGS. 1 to 3, a substrate 100 may include a single crystal semiconductor material. The substrate 100 may include a semiconductor material such as silicon, germanium, silicon-germanium, and/or the like. In example embodiments, the substrate 100 may be single crystal silicon.

A hard mask pattern (not shown) may be formed on the substrate 100. The substrate 100 may be etched using the hard mask pattern as an etching mask to form first active patterns 102 and a trench 104. The first active patterns 102 may protrude from the substrate 100, and the trench 104 may be formed between the first active patterns 102. In example embodiments, the first active pattern 102 may serve as an active region for forming a DRAM device. Thereafter, the hard mask pattern may be removed.

Hereinafter, the substrate 100 and the first active patterns 102 are described as different elements. However, the first active patterns 102 may be formed by etching the substrate 100, so that the first active patterns 102 and the substrate 100 may include the same semiconductor material. Also, the first active patterns 102 and the substrate 100 may be the same single body.

The first active patterns 102 may be isolated to each other, and the first active patterns 102 may be regularly arranged. Sidewalls of the trench 104 may correspond to sidewalls of the first active patterns 102, and bottom of the trench 104 may correspond to a surface of the substrate 100.

In example embodiments, the first active pattern 102 may extend in the third direction. That is, a length in the third direction of the first active pattern 102 may be greater than a length in the fourth direction of the first active pattern 102. Therefore, in the first active pattern 102, the third direction may be a long axis direction, and the fourth direction may be a short axis direction.

When the process is performed, the surface of the substrate 100 and the surface of the first active pattern 102 may be exposed. In this case, at least a portion of the surface of the substrate 100 and the surface of the first active pattern 102 may be irregularly oxidized. That is, a native oxide layer 106 may be formed on the surfaces of the substrate 100 and the first active pattern 102. The native oxide layer 106 may be discontinuous and irregular, or alternatively, may appear as islands of oxide material.

Figure 4:
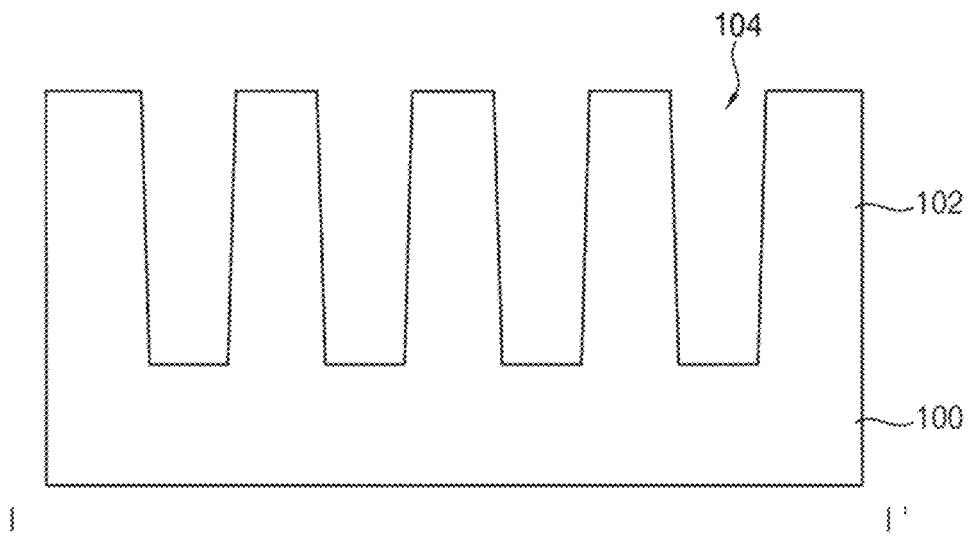
Figure 5:
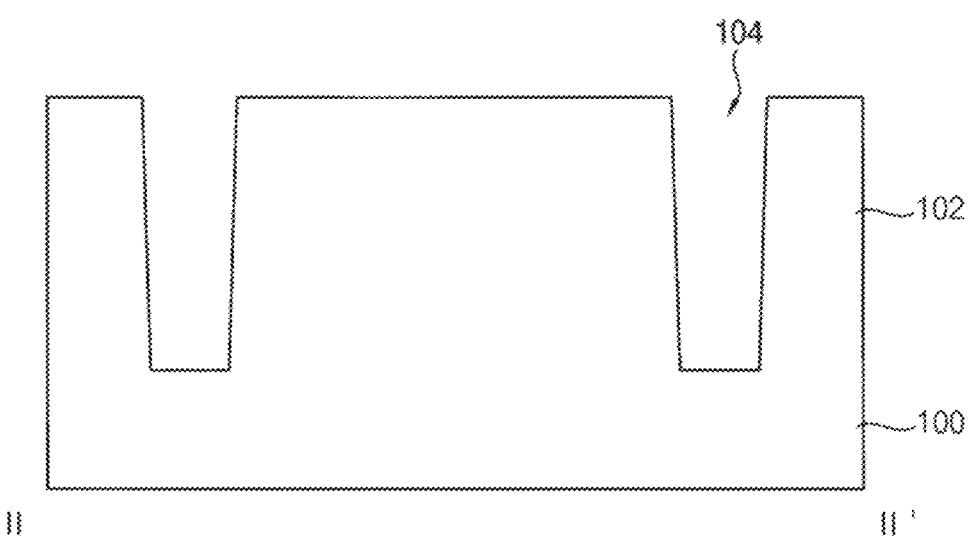
Figure 6:
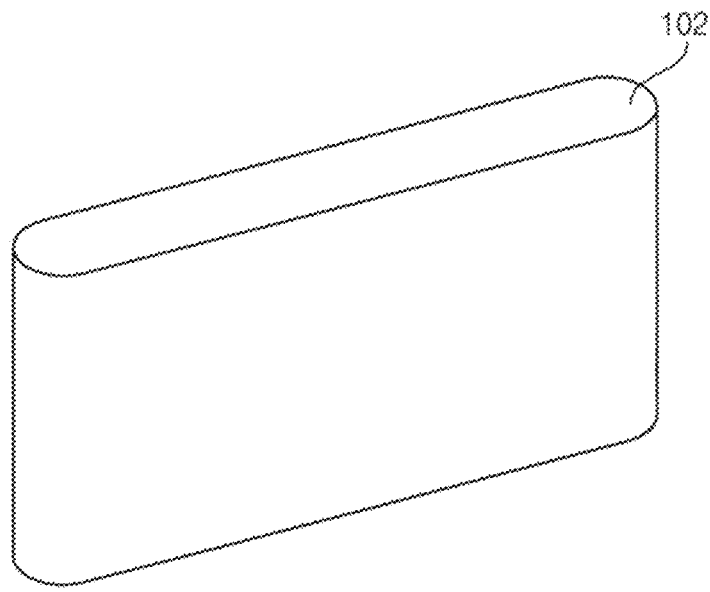
Figure 7:
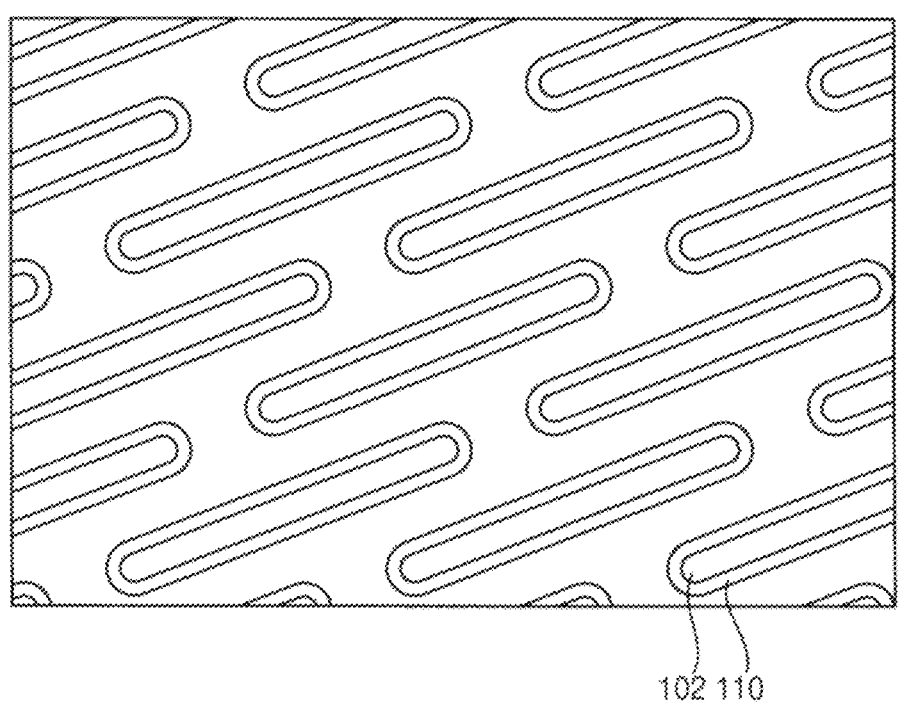
Figure 8:
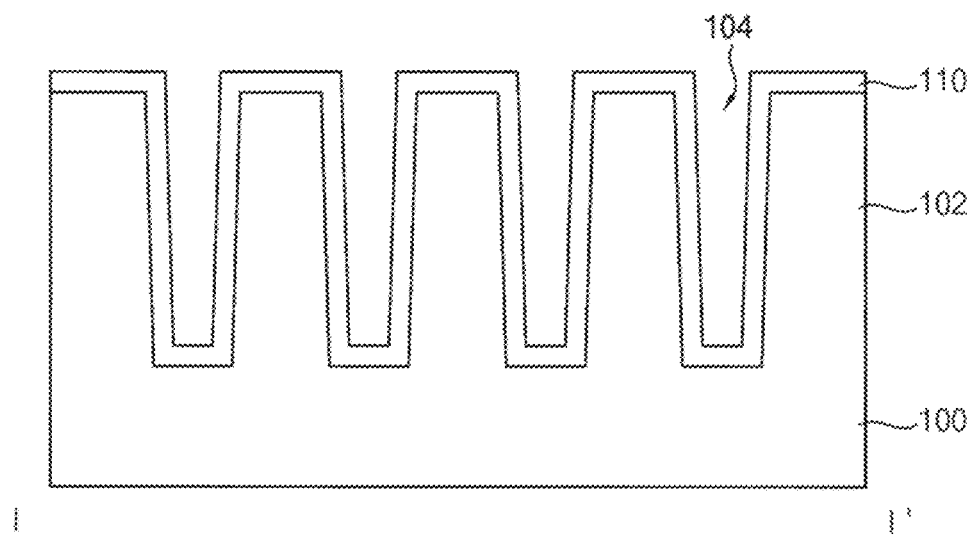
Figure 9:
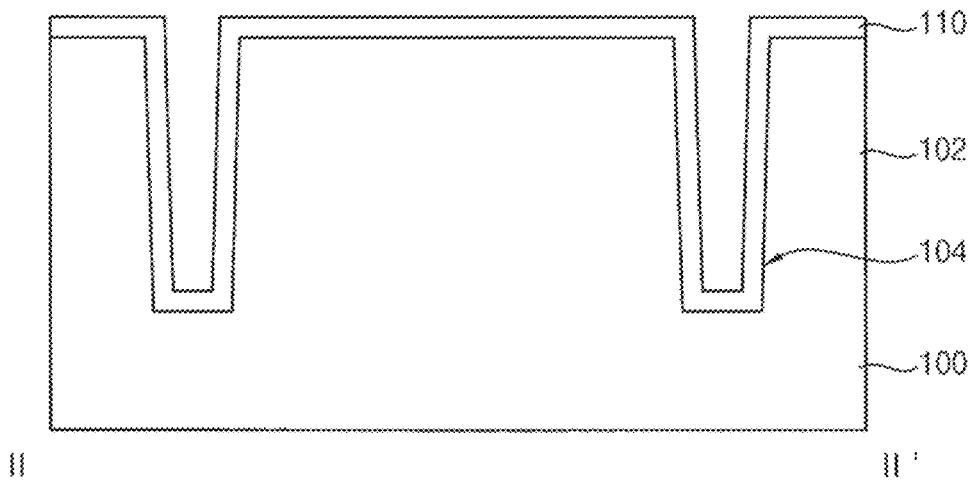
Figure 10:
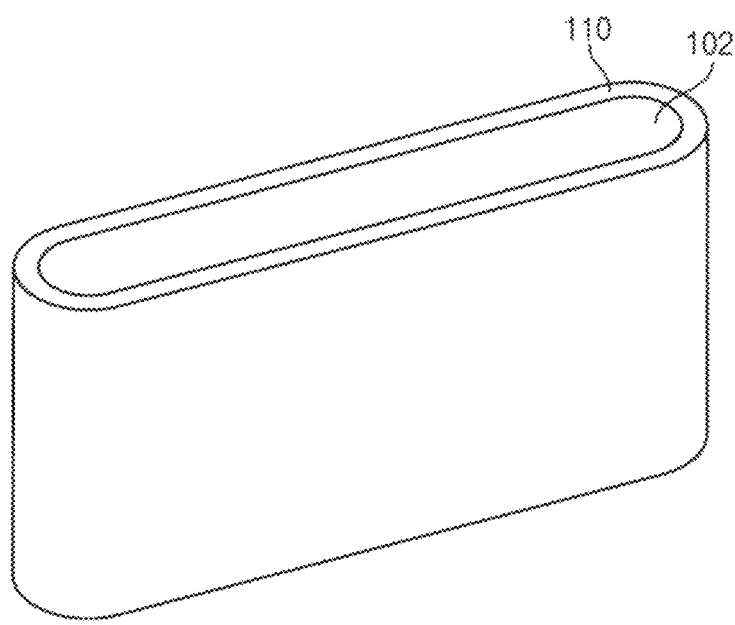

Referring to FIGS. 4 to 6, the native oxide layer 106 formed on the substrate 100 and the first active pattern 102 may be removed. The removing process of the native oxide layer 106 may include a dry etching process or a wet etching process.

In example embodiments, for removing the native oxide layer 106, a first process of introducing etching source gases onto the surfaces of the substrate 100 and the first active pattern 102 may be performed. Thus, at least one of the etching source gases may contact the surfaces of the substrate 100 and the first active pattern 102. In example embodiments, the etch source gases may include Ar, NH3 and/or NF3.

Thereafter, a second process of applying heat and pressure to the substrate 100 and the first active pattern 102 may be performed. The native oxide layer 106 may be removed by the first and second processes.

In example embodiments, the first process of introducing the etching source gases and the second process of applying heat and pressure may be performed in different etching chambers, respectively. That is, the first process may be performed in a first etching chamber, and the second process may be performed in a second etching chamber. The first process and the second process may be performed in situ without a vacuum brake.

The first process may be performed at room temperature. For example, the first process may be performed at a temperature in range of about 5° C. to about 30° C. Also, the first process may be performed at a pressure in a range of about 0.5 Torr to about 10 Torr.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The second process may be performed at a temperature in a range of about 100° C. to about 200° C., and the second process may be performed at a pressure in a range of about 1 Torr to about 20 Torr.

Referring to FIGS. 7 to 10, a semiconductor liner having a crystalline structure may be formed on the substrate 100 and the first active pattern 102 having no native oxide layer.

In example embodiments, the semiconductor liner may be a crystalline silicon liner. Hereinafter, the semiconductor liner is referred to as a first silicon liner 110.

The first silicon liner 110 may be formed by crystal growth from the surfaces of the substrate 100 and the first active pattern 102. Thus, the first silicon liner 110 may have a crystalline structure substantially the same as crystalline structures of the substrate 100 and the first active pattern 102.

The first silicon liner 110 may cover entire surfaces of the first active patterns 102 and the substrate 100. That is, a blocking layer may not be formed on the substrate 100 and the first active pattern 102, so that the first silicon liner 110 may be formed by crystal growth from the entire surfaces of the substrate 100 and the first active pattern 102. In other words, the first silicon liner may directly contact the substrate 100 and the first active pattern 102.

The first silicon liner 110 may not be formed as amorphous but may be already formed to have a crystalline structure in the deposition process. Thus, a crystallization process may not be performed in a subsequent process. Therefore, an amorphous silicon layer with a partially and/or unevenly crystallized surface in the crystallization process may be avoided, and thus a poor surface roughness of the silicon liner may be decreased.

In addition, the surface of the first silicon liner 110 may be uniformly oxidized in a subsequent process.

If the native oxide layer 106 is on the surfaces of the substrate 100 and the first active patterns 102 during forming of the first silicon liner 110, the first silicon liner 110 may include crystal defects formed by the deposition process of the first silicon liner 110. Therefore, when the first silicon liner 110 is formed, the native oxide layer 106 may not be on the surfaces of the substrate 100 and the first active pattern 102. That is, the deposition process of the first silicon liner 110 and removing the native oxide layer 106 may be performed in situ, and the processes may be performed without a vacuum brake.

For forming the first silicon liner 110 having a crystalline structure, the deposition process may be performed at high temperature and high pressure, and conditions of the deposition process may be adjusted to increase a partial pressure of the silicon source gas.

Particularly, the process for forming the first silicon liner 110 may be performed at a pressure in range of about 50 Torr to about 500 Torr. A process temperature may be in range of about 400° C. to about 800° C. The silicon source gas may be, e.g., monosilane, disilane, dichlorosilane (DCS), and/or the like. The silicon source gas may be introduced to have a flow rate of about 30 standard cubic centimeters per minute (sccm) to about 150 sccm.

The silicon source gas may not include carbon. Further, in the deposition process, a process for forming a silicon seed layer including carbon may be omitted. Thus, the first silicon liner 110 may not include the carbon. As a result, defects caused by the carbon included in the first silicon liner may be decreased.

In order to satisfy the temperature and the pressure conditions, a volume in the deposition chamber for forming the first silicon liner 110 may be about 20 L or less. For example, the volume may be about 5 L to about 20 L. In the deposition process, the nitrogen gas may be introduced into the deposition chamber to have a flow rate of about 100 sccm or more. For example, the nitrogen gas may be introduced to have a flow rate of about 100 sccm to about 10000 sccm.

As described above, the first silicon liner 110 having no crystal defects may be formed, and the first silicon liner 110 may have a crystal structure substantially the same as those of the substrate 100 and the first active pattern 102.

In example embodiments, the first silicon liner 110 may be uniformly grown on the surfaces of the first active pattern 102 and the substrate 100. Therefore, the first silicon liner 110 may be conformally formed on the sidewall and upper surface of the first active pattern 102 and the surface of the substrate 100 to have a uniform thickness.

The first silicon liner 110 may have a thickness such that the surface of the first active pattern 102 may not be oxidized during forming the first insulation layer. The first silicon liner 110 may be formed to not completely fill the trench 104. Thus, the first silicon liner 110 may be formed to have a thickness less than a half of a minimum width of the trench 104. In example embodiments, the first silicon liner 110 may be formed to have a thickness in range of about 30 Å to about 100 Å.

FIG. 11 is an example of an apparatus for etching the native oxide layer and depositing the first silicon liner.

Referring to FIG. 11, the apparatus may include a first etching chamber 20a and a second etching chamber 20b for the etching process and a deposition chamber 22 for the deposition process. Each of the first and second etching chambers 20a and 20b and the deposition chamber 22 may be connected to a transfer chamber 16. The transfer chamber 16 may include transfer members 18 for transferring the substrate 100.

The substrate 100 may be sequentially, or, alternatively, selectively, transferred to the first etching chamber 20a, the second etching chamber 20b, and the deposition chamber 22 while the vacuum may be maintained by the transfer chamber 16. The transfer chamber 16 may be connected to the load lock chamber 14. The load lock chamber 14 may be connected to a transfer port 12 and a load port 10 including a cassette or a foup for receiving the substrate 100.

Hereinafter, the etching the native oxide layer and the deposition process of the first silicon liner using the apparatus may be briefly described.

First, for performing the etching process illustrated with reference to FIGS. 4 to 6, the substrate may be loaded in the first etching chamber 20a, and the etching source gas may be introduced into the first etching chamber 20a. Thereafter, the substrate is transferred to the second etching chamber 20b via the transfer chamber 16. The native oxide layer formed on the substrate and the first active patterns may be removed by controlling the temperature and the pressure in the second etching chamber 20b.

Thereafter, for performing the deposition process illustrated with reference to FIGS. 7 to 10, the substrate may be loaded onto a chuck in the deposition chamber 22 via the transfer chamber 16. The first silicon liner may be formed in the deposition chamber 22.

As described above, the vacuum may be maintained in the etching process and the deposition process, so that the surfaces of the first active patterns 102 may not be oxidized during moving the substrate between the chambers. Thus, defects such as crystal defects or particle adsorption caused by the native oxide layer on the surfaces of the first active patterns 102 may be decreased.

Referring to FIGS. 12 to 15, a first insulation layer 112 may be formed on the first silicon liner 110 by a deposition process. The first insulation layer 112 may include silicon oxide. The deposition process may include a chemical vapor deposition process or an atomic layer deposition process.

When the first insulation layer 112 is formed, the surface of the first silicon liner 110 may be oxidized by heat and oxygen source. By the oxidation, the first silicon liner 110 may be transformed to a second silicon liner 110a having a thickness less than that of the first silicon liner 110.

That is, when the deposition process is performed, the first insulation layer 112 may be conformally formed on the second silicon liner 110a. In this case, the first insulation layer 112 may include an oxide layer formed by oxidizing the surface of the first silicon liner 110 and an oxide layer formed by the deposition process.

The first silicon liner 110 may have a crystalline structure, and a native oxide layer may not be on the surface of the first silicon liner 110. Therefore, the surface of the first silicon liner 110 may be uniformly oxidized, so that the surface of the second silicon liner 110a may have an excellent roughness after the oxidation. Also, crystal defects due to irregular oxidation of the second silicon liner 110a may hardly occur.

The first silicon liner 110 may serve as a layer to prevent oxidation of the first active pattern 102 in subsequent processes. When the first insulation layer 112 is formed, the first active pattern 102 may not be oxidized. The first active pattern 102 may not be consumed by the oxidation, and thus an area of the upper surface of the first active pattern 102 may not be reduced.

In example embodiments, a thickness of the first insulation layer 112 may be greater than a thickness of the second silicon liner 110a.

The second silicon liner 110a may cover entire surfaces of the first active patterns 102 and the substrate 100. In example embodiments, the second silicon liner 110a may have a uniform thickness from the surfaces of the first active pattern 102 and the substrate.

In some example embodiments, when the first insulation layer 112 is formed, the first silicon liner 110 may be fully oxidized. In this case, all of the first silicon liner 110 may be consumed, and thus the first insulation layer 112 may be formed on the first active pattern 102.

Figure 16:
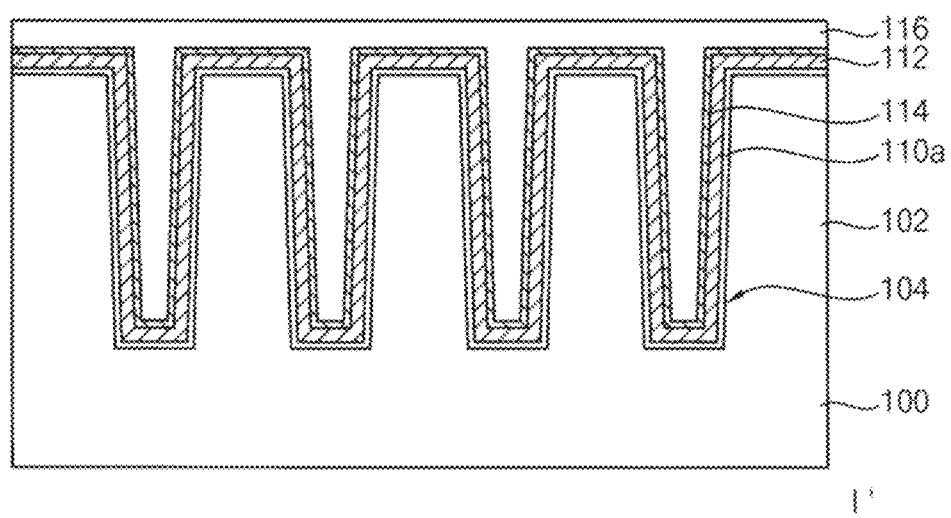
Figure 17:
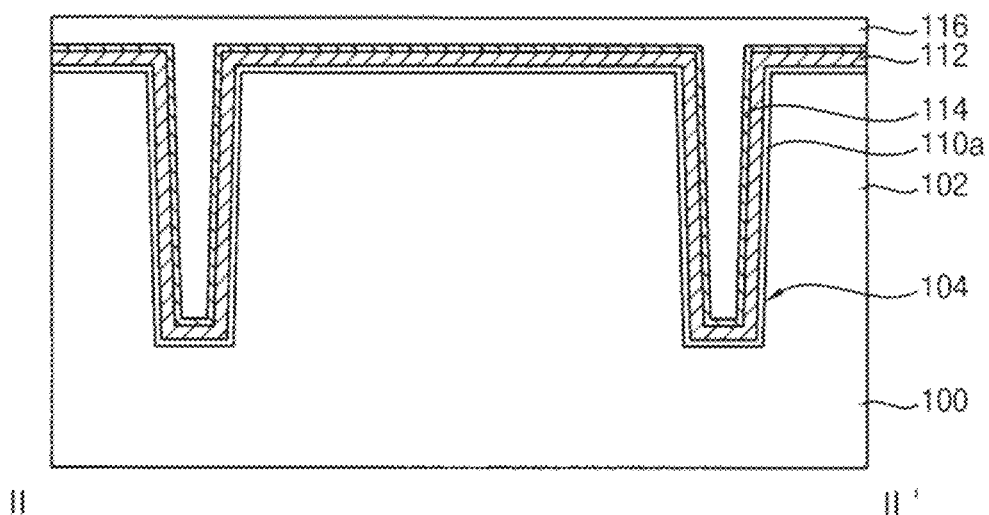

Referring to FIGS. 16 and 17, a stop layer 114 may be conformally formed on the first insulation layer 112. Thereafter, an isolation layer 116 may be formed on the stop layer 114 to completely fill the trench 104.

In example embodiments, the stop layer 114 may include silicon nitride and/or silicon oxynitride. The isolation layer 116 may include silicon oxide.

The process for forming the stop layer 114 and the isolation layer 116 may include a chemical vapor deposition process or an atomic layer deposition process.

In some example embodiments, the stop layer 114 may not be formed. In this case, only the isolation layer 116 may be formed on the first insulation layer 112. Also, the first insulation layer 112 and the isolation layer 116 may be formed by the same deposition process.

Figure 18:
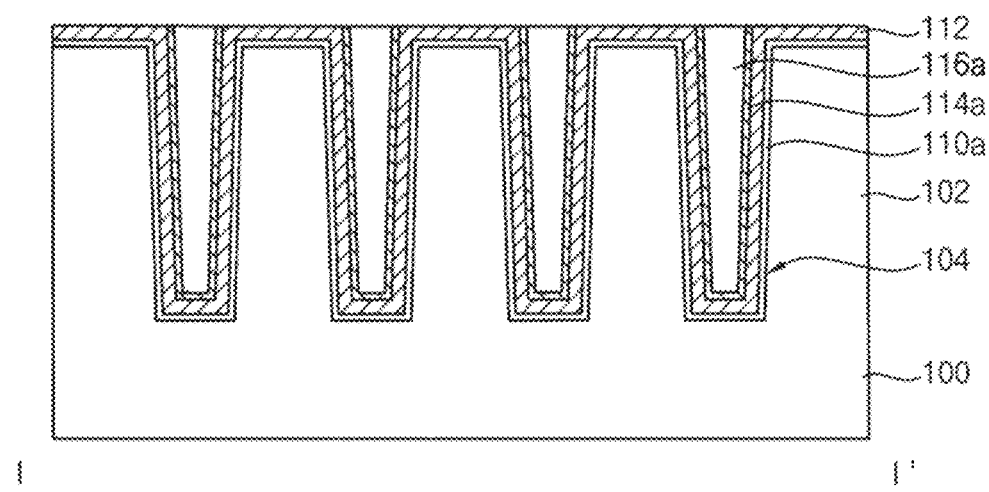
Figure 19:
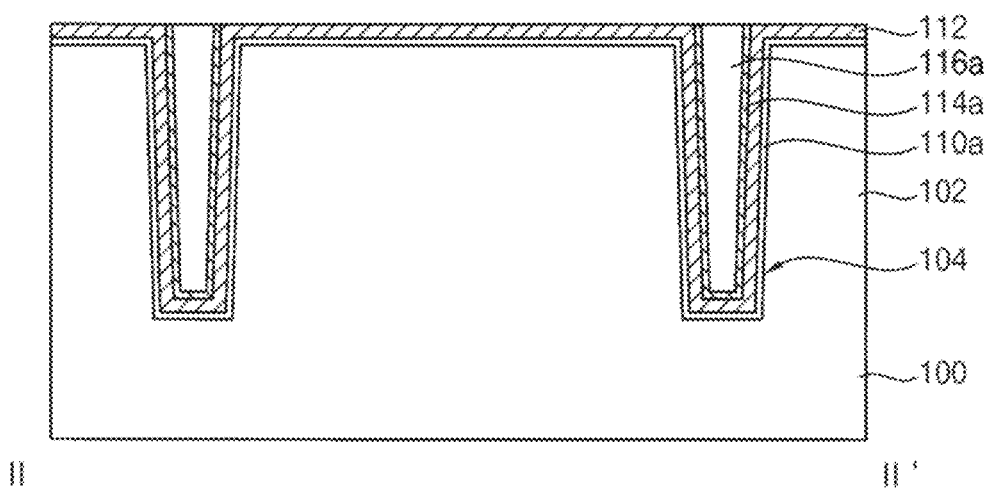

Referring to FIGS. 18 and 19, an upper surface of the isolation layer 116 may be planarized until an upper surface of the stop layer 114 may be exposed to form an isolation pattern 116a. The isolation pattern 116a may fill the trench 104. The planarization process may be performed by a chemical mechanical polishing (CMP) process and/or an etch back process. Thereafter, an exposed portion of the stop layer 114 may be etched to form a stop layer pattern 114a.

Thus, the second silicon liner 110a, the first insulation layer 112, the stop layer pattern 114a and the isolation pattern 116a may be formed in the trench 104. Also, the second silicon liner 110a and the first insulation layer 112 may be formed on an upper surface of the first active pattern 102.

The first active pattern 102 and the second silicon liner 110a may serve as an active region. The first insulation layer 112, the stop layer pattern 114a and the isolation pattern 116a formed in the trench 104 may serve as a field region. During the process for forming the field region, an area of the upper surface of the first active pattern 102 and a volume of the first active pattern 102 may not be decreased, so that the active region may have a sufficient area.

Figure 20:
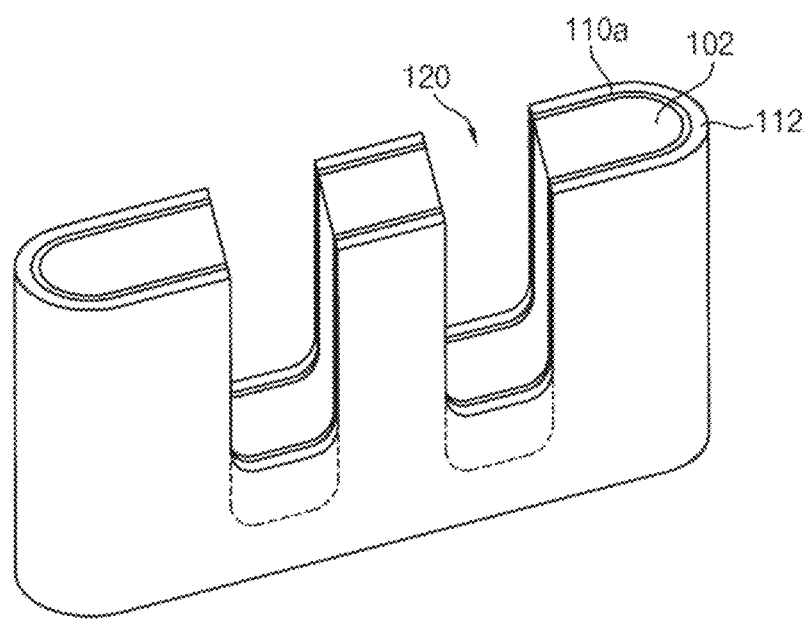

Referring to FIG. 20, the first active pattern 102, the second silicon liner 110a, the first insulation layer 112, the stop layer pattern 114a and the isolation pattern 116a may be partially etched to form a gate trench 120 extending in the first direction.

A bottom of the gate trench 120 may be higher than a bottom of the isolation pattern 116a.

In example embodiments, a bottom of the gate trench 120 disposed at the field region may be lower than a bottom of the gate trench 120 disposed at the active region. Thus, portions of the first active pattern and the isolation pattern may be exposed on the bottom of the gate trench 120. The first active pattern 102 formed in the gate trench 120 may be protrude from the isolation pattern 116a formed in the gate trench 120. Portions of the first active pattern 102 and the second silicon liner 110a may be exposed on sidewalls of the gate trench 120 in the first direction.

Figure 21:
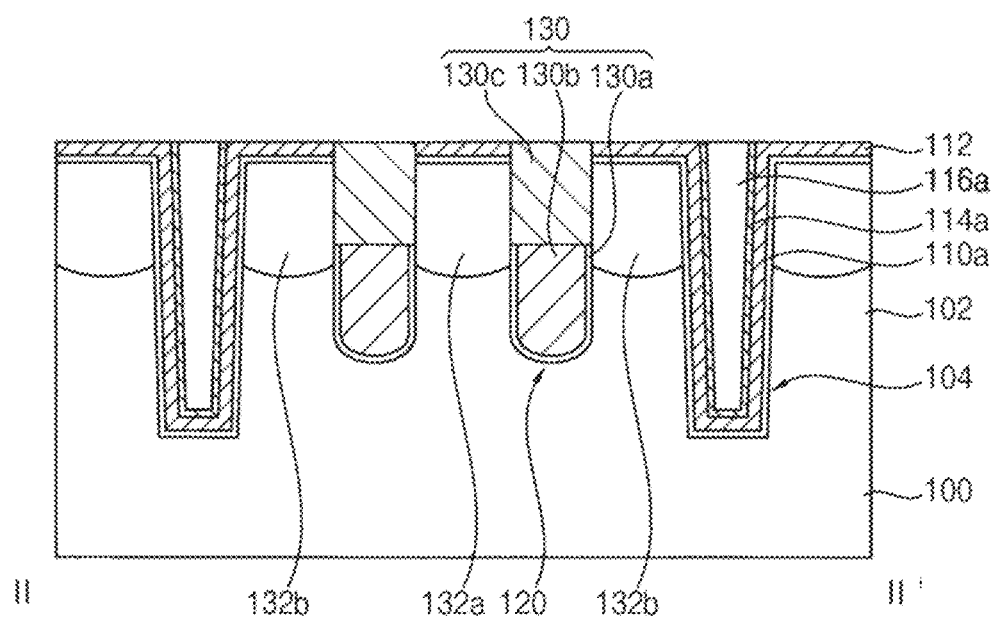
Figure 22:
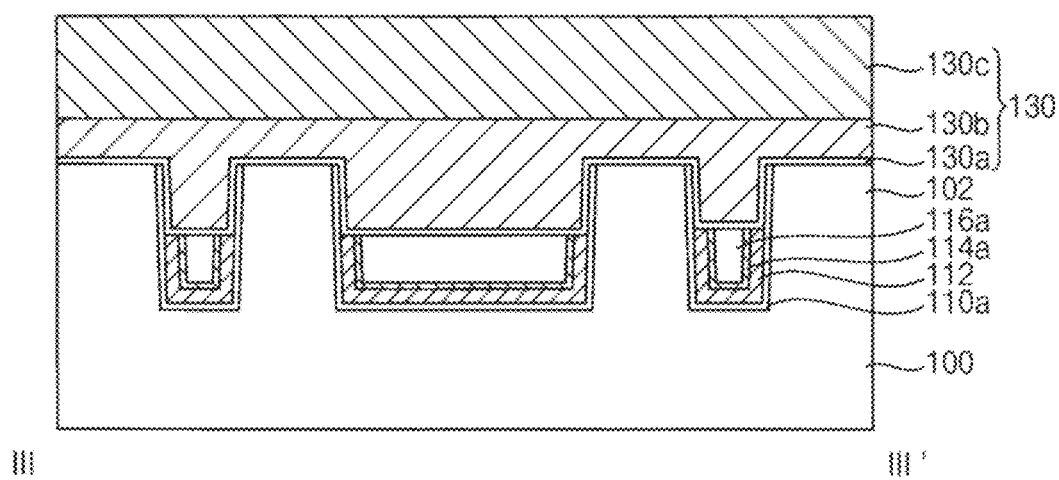

Referring to FIGS. 21 and 22, a gate structure 130 is formed in the gate trench 120.

The gate structure 130 may include a gate insulation layer pattern 130a, a gate electrode 130b and a capping layer pattern 130c.

The gate insulation layer pattern 130a may be conformally formed on surfaces of the first active pattern 102 and the second silicon liner 110a in the gate trench 120. The gate electrode 130b may contact the gate insulation layer pattern 130a, and the gate electrode 130b may be formed in the gate trench 120. In example embodiments, the gate electrode 130b may include a metal. The gate electrode 130b may have a stacked structure including a barrier metal layer and a metal layer. For example, the gate electrode 130b may include tungsten nitride or tungsten. In some example embodiments, the gate electrode 130b may include a polysilicon.

The capping layer pattern 130c may be formed on the gate electrode 130b to fill the gate trench 120. The capping layer pattern 130c may include nitride, e.g., silicon nitride.

First and second impurity regions 132a and 132b serving as source/drain regions may be formed at the first active pattern 102 and the second silicon liner 110a adjacent to both sides of the gate structure 130. For example, the first impurity region 132a may have one side adjacent the active pattern 102, one side adjacent one side of the gate structure 130, and at least one side adjacent the second silicon liner 110a. Further, the second impurity region 132b may have one side adjacent the active pattern 102, one side adjacent another side of the gate structure 130, and at least one side adjacent the second silicon liner 110a.

Figure 23:
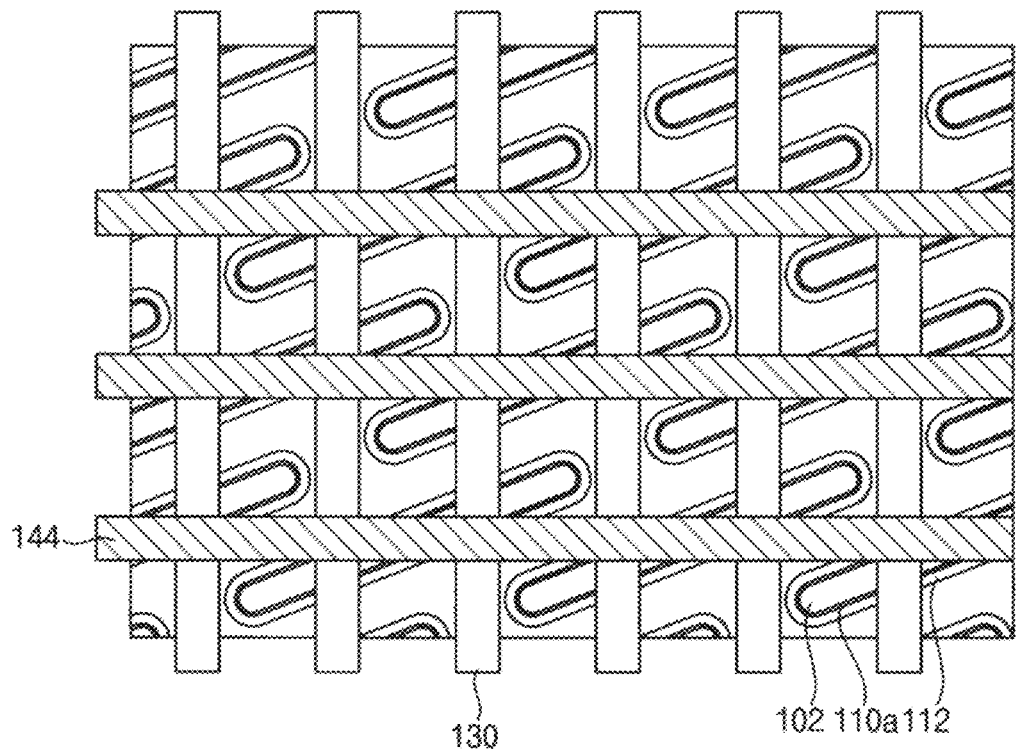
Figure 24:
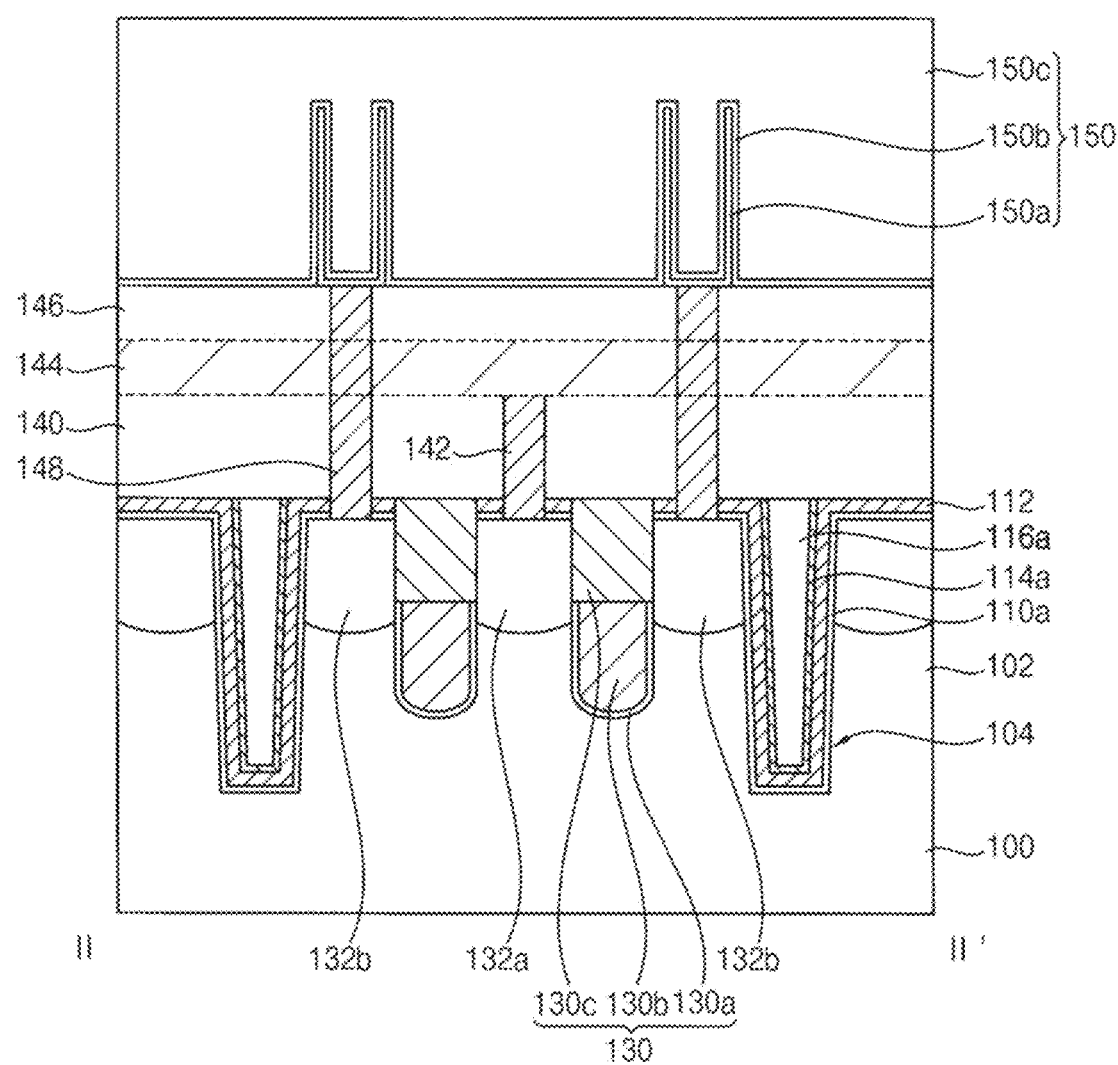

Referring to FIGS. 23 and 24, a first insulating interlayer 140 may be formed on the gate structure 130, the first active pattern 102, the second silicon liner 110a, the first insulation layer 112, the stop layer pattern 114a and the isolation pattern 116a. The first insulating interlayer 140 may include an oxide such as silicon oxide.

A first contact plug 142 may be formed through the first insulating interlayer 140, the first insulation layer 112 and the second silicon liner 110a. The first contact plug 142 may contact the first impurity region 132a. A bit line 144 may be formed on the first contact plug 142 and the first insulating interlayer 140. The bit line 144 may extend in the second direction.

The bit line 144 may be formed to contact an upper surface of the first contact plug 142. A hard mask pattern (not shown) may be formed on the bit line 144. Spacers (not shown) may be formed on the sidewalls of the bit lines 144 and the hard mask patterns.

A second insulating interlayer 146 covering the bit line 144 may be formed on the first insulating interlayer 140.

A second contact plug 148 may be formed through the second insulating interlayer 146, the first insulating interlayer 140, the first insulation layer 112 and the second silicon liner 110a. The second contact plug 148 may contact the second impurity region 132b. The second contact plug 148 may be formed so that a short failure between the second contact plug 148 and the bit line 144 may not occur.

As described above, the oxidation of the surface of the first active pattern 102 may hardly occur during the processes. Therefore, an area of the upper surface of the first active pattern 102 may not be reduced. The first and second contact plugs 142 and 148 may be formed on the first active pattern 102 to have sufficient area margin. Further, as the area of the upper surface of the first active pattern 102 is sufficient, resistances of the first and second contact plugs 142 and 148 may be decreased.

A capacitor 150 may be formed to contact the second contact plug 148. The capacitor 150 may include a lower electrode 150a, a dielectric layer 150b and an upper electrode 150c.

The semiconductor device may have following structural features. The structural features of the semiconductor device may be mostly described in the process of manufacturing the semiconductor device. Therefore, hereinafter, repeated descriptions may be omitted and only important parts may be described with reference to the drawings.

Referring to FIGS. 20 to 24, the first active patterns 102 may be formed on the substrate 100. The trench 104 may be formed between the first active patterns 102.

The second silicon liner 110a covering the surface of the first active pattern 102 may be formed on the first active pattern 102. The second silicon liner 110a may be conformally formed on the surface of the first active pattern 102. The second silicon liner 110a may cover entire surfaces of the first active patterns 102 and the substrate 100.

The second silicon liner 110a may include crystalline silicon.

The first insulation layer 112 may be formed on the second silicon liner 110a. The first insulation layer 112 may include silicon oxide. At least portions of the first insulation layer 112 may be formed by oxidizing the surface of a silicon liner.

In example embodiments, a thickness of the first insulation layer 112 may be greater than a thickness of the second silicon liner 110a.

The stop layer pattern 114a and the isolation pattern 116a may be formed on the first insulation layer 112 to fill the trench 104.

The gate trench 120 may be formed at portions of the first active pattern 102, the second silicon liner 110a, the first insulation layer 112, the stop layer pattern 114a and the isolation pattern 116a, and the gate trench may extend in the first direction.

The gate structure 130 may be formed in the gate trench 120. The gate structure 130 may include a gate insulation layer pattern 130a, a gate electrode 130b and a capping layer pattern 130c.

In example embodiments, the bottom of the gate trench 120 in the field region may be lower than the bottom of the gate trench 120 in the active region.

Thus, the first active pattern 102 and the second silicon liner 110a may be exposed at both sides in the first direction in the gate trench 120.

That is, the gate insulation layer pattern 130a may contact the first active pattern 102 and the second silicon liner 110a exposed by the gate trench 120. As the roughness of the surface of the second silicon liner 110a is very good and the second silicon liner has no crystal defects, crystal defects may not include in the gate insulation layer pattern 130a. Therefore, leakage currents of the transistor caused by the gate insulation layer pattern 130a may be decreased.

First and second impurity regions 132a and 132b serving as a source/drain may be formed on the first active pattern 102 and the second silicon liner 110a adjacent to the both sides of the gate structure 130.

The first insulating interlayer 140 may be formed on the gate structure 130, the first active pattern 102, the second silicon liner 110a, the first insulation layer 112, the stop layer pattern 114a and the isolation pattern 116a.

The first contact plug 142 may be formed through the first insulating interlayer 140, the first insulation layer 112 and the second silicon liner 110a. The first contact plug may contact the first impurity region 132a. The bit line 144 may be formed on the first contact plug 142 and the first insulating interlayer 140.

The second insulating interlayer 146 covering the bit line 144 may be formed on the first insulating interlayer 140.

The second contact plug 148 may be formed through the second insulating interlayer 146, the first insulating interlayer 140, the first insulation layer 112 and the second silicon liner 110a. The second contact plug 148 may contact the second impurity region 132b.

The capacitor 150 may contact the second contact plug 148.

Thus, the first and second contact plugs 142 and 148 may be formed on the first active pattern 102. The first active pattern 102 may have a sufficient area to form the first and second contact plugs 142 and 148.

Further, crystal defects included in the gate insulation layer pattern 130a may decrease, so that leakage currents of the transistor caused by the gate insulation layer pattern 130a may be reduced. Therefore, a reliability failure of the transistor may be decreased.

Figure 25:
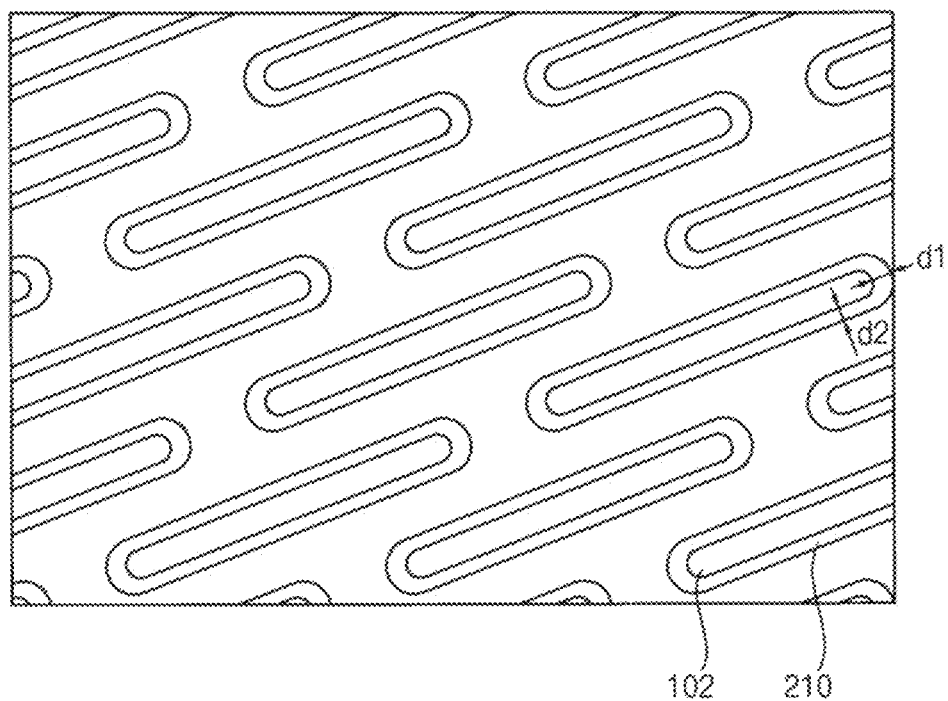
Figure 26:
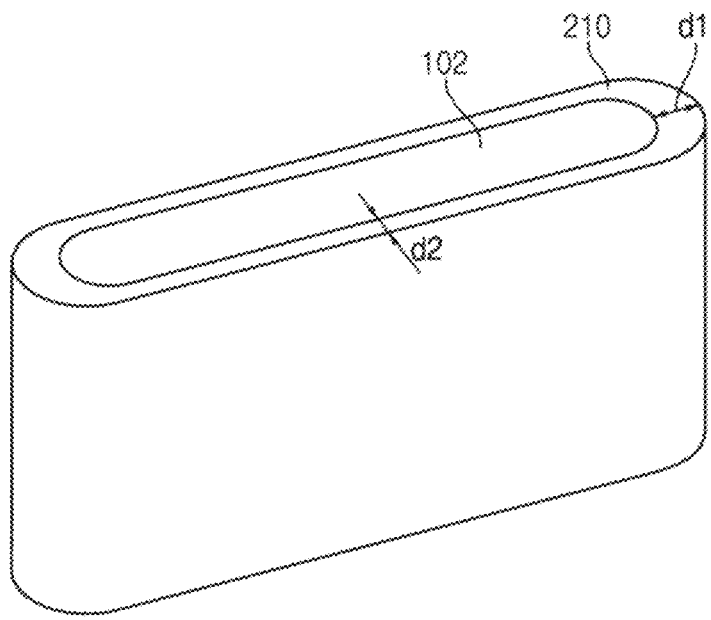
Figure 27:
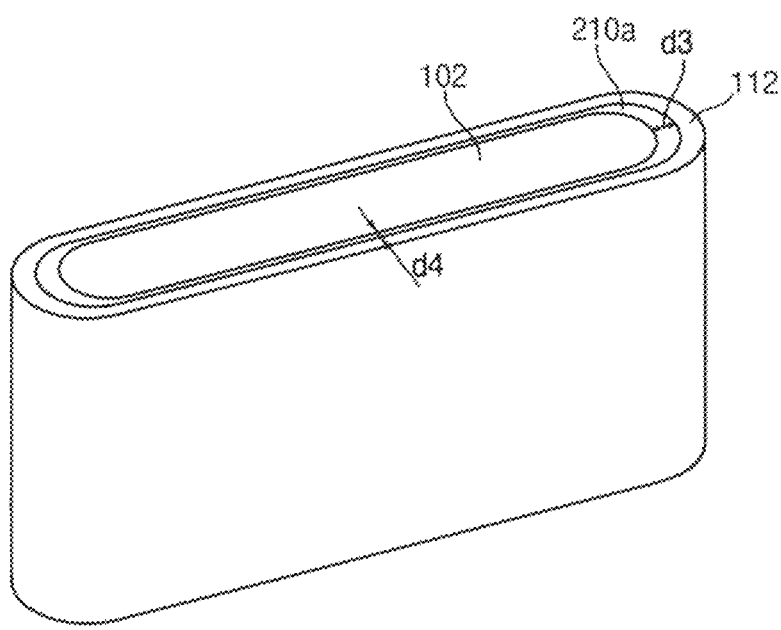

FIGS. 25 to 27 are plan views and perspective views illustrating stages of a method of manufacturing a semiconductor device in accordance with example embodiments. FIG. 25 is a plan view. FIGS. 26 and 27 only illustrate the layers formed on the sidewalls of one of the active patterns.

The method may be substantially the same as the method of manufacturing the semiconductor device illustrated with reference to FIGS. 1 to 24, except for forming the first silicon liner.

First, the same processes illustrated with reference to FIGS. 1 to 6 may be performed. Thus, the native oxide layer 106 (referred to FIG. 3) formed on the surfaces of the substrate 100 and the first active pattern 102 may be removed.

Referring to FIGS. 25 and 26, a first silicon liner 210 having a crystalline structure may be formed on the substrate 100 and the first active pattern 102 having no native oxide layer.

The first silicon liner 210 may be formed by a crystal growth from the surfaces of the substrate 100 and the first active pattern 102. In this case, a growth rate of the crystal may be different depending on the surface of the first active pattern 102.

In example embodiments, in the crystal growth of the first silicon liner 210, the growth rate at sidewall surfaces of the first active pattern in a long axis direction (i.e., a third direction) and the growth rate at sidewall surfaces of the first active pattern in a short axis direction (i.e., a fourth direction) may be different to each other. For example, the growth rate of the first silicon liner 210 at the sidewalls of the first active pattern 102 in the third direction may be higher than the growth rate of the first silicon liner 210 at the sidewalls of the first active pattern 102 in the fourth direction. Therefore, a first thickness d1 of the first silicon liner 210 on the sidewall of the first active pattern 102 in the third direction may be greater than a second thickness d2 of the first silicon liner 210 on the sidewall of the first active pattern 102 in the fourth direction.

The growth rate of the first silicon liner 210 may be changed by controlling a temperature and a pressure during the deposition process of the first silicon liner 210. In addition, the growth rate of the first silicon liner 210 may be changed by process conditions for removing the native oxide layer.

In example embodiments, the process for removing the native oxide layer may be substantially the same as illustrated with reference to FIGS. 4 to 6. That is, the first process may be performed at room temperature. For example, the first process may be performed at a temperature in range of about 5° C. to about 30° C. Also, the first process may be performed at a pressure in range of about 0.5 Torr to about 10 Torr. The second process may be performed at a temperature in range of about 100° C. to about 200° C. Also, the second process may be performed at a pressure in range of about 1 Torr to about 20 Torr. When the native oxide layer is removed by the process conditions, the deposition process may be performed at a temperature in range of about 400° C. to about 490° C. and a pressure in range of about 50 Torr to 150 Torr.

Referring to FIG. 27, the first insulation layer 112 may be formed on the first silicon liner 210 by a deposition process. When the deposition process is performed, the first silicon liner 210 may be oxidized to reduce the thickness of the first silicon liner 210. Thus, the first silicon liner 210 may be transformed to the second silicon liner 210a. The first insulation layer 112 may be formed on the second silicon liner 210a.

In this case, the first silicon liner 210 is oxidized to a uniform thickness. Therefore, a thickness of the second silicon liner 210a formed on the sidewalls of the first active pattern 102 in the long axis direction and a thickness of the second silicon liner 210a formed on the sidewalls of the first active pattern 102 in the short axis direction may be different to each other. That is, a third thickness d3 of the second silicon liner 210a on the sidewall of the first active pattern 102 in the third direction may be greater than a fourth thickness d4 of the second silicon liner 210b on the sidewall of the first active pattern 102 in the fourth direction.

A thickness of the first insulation layer 112 may be greater than a thickness of the second silicon liner 210a.

Thereafter, the same processes illustrated with reference to FIGS. 16 to 24 may be performed. Therefore, an active region having a sufficient area in the third direction may be formed.

The semiconductor device may have a structure substantially the same as a structure of semiconductor device illustrated with reference to FIGS. 23 and 24. However, in the second silicon liner 210a, the third thickness d3 of the second silicon liner 210a on the sidewall of the first active pattern 102 in the third direction may be greater than the fourth thickness d4 of the second silicon liner 210a in the fourth direction on the sidewalls of the first active pattern 102. Thus, an area of the first active pattern 102 for forming the first and second contact plugs 142 and 148 may be sufficiently secured.

Figure 28:
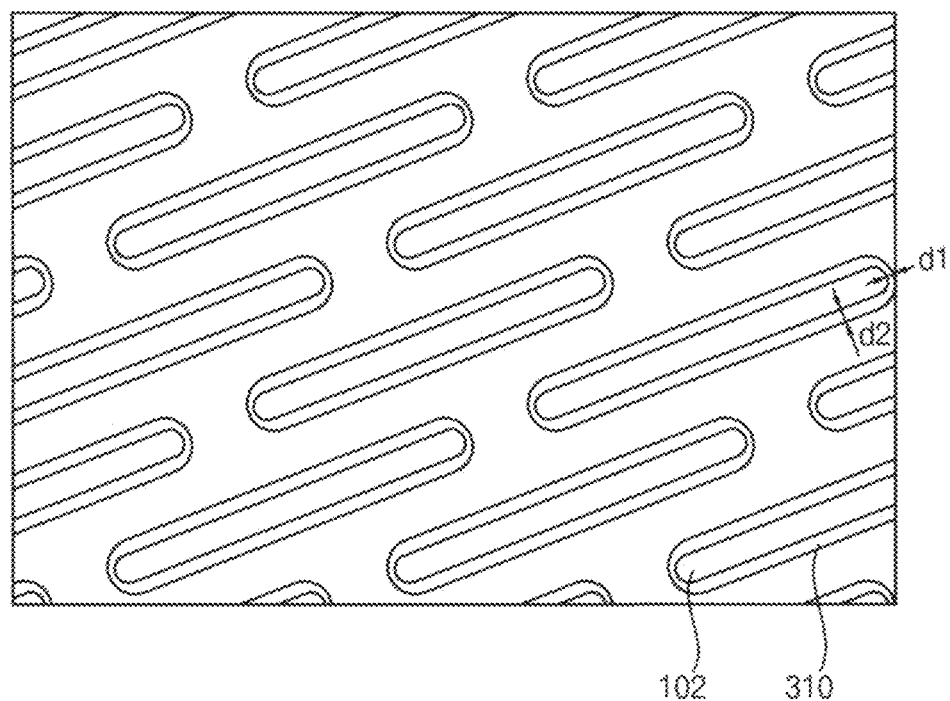
Figure 29:
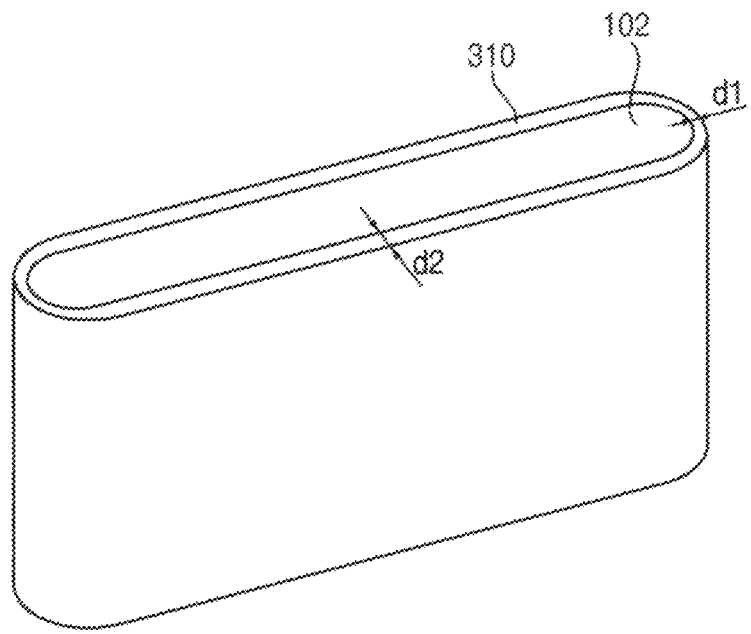
Figure 30:
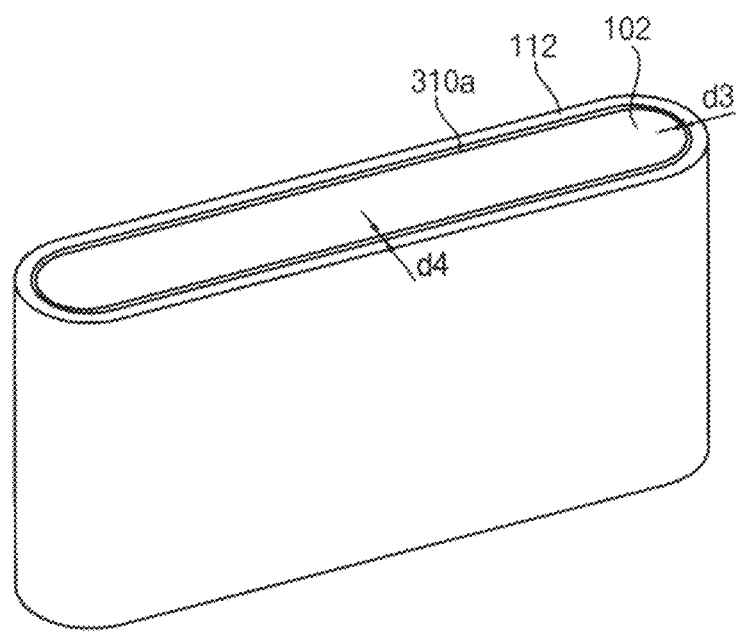

FIGS. 28 to 30 are a plan view and perspective views illustrating stages of a method of manufacturing a semiconductor device in accordance with example embodiments. FIG. 28 is a plan view. FIGS. 29 and 30 only illustrate the layers formed on the sidewalls of one of the active patterns.

The method may be substantially the same as the method of manufacturing the semiconductor device illustrated with reference to FIGS. 1 to 24, except for forming the first silicon liner.

First, the same processes illustrated with reference to FIGS. 1 to 6 may be performed. Thus, the native oxide layer 106 (referred to FIG. 3) formed on the surfaces of the substrate 100 and the first active pattern 102 may be removed.

Referring to FIGS. 28 and 29, the first silicon liner 310 having a crystalline structure may be formed on the substrate 100 and the first active pattern 102 having no native oxide layer.

In example embodiments, a growth rate of the first silicon liner 310 on the sidewalls of the first active pattern 102 in the third direction may be lower than a growth rate of the first silicon liner 310 on the sidewalls of the first active pattern 102 in the fourth direction. Thus, a first thickness d1 of the first silicon liner 310 on the sidewall of the first active pattern 102 in the third direction may be less than a second thickness d2 of the first silicon liner 310 on the sidewall of the first active pattern 102 in the fourth direction.

The growth rate of the first silicon liner 310 may be changed by controlling the temperature and the pressure during the deposition process of the first silicon liner 310. Also, the growth rate of the first silicon liner 310 may be changed by controlling the process conditions for removing the native oxide layer.

In example embodiments, the process for removing the native oxide layer may be substantially the same as the processes illustrated with reference to FIGS. 4 to 6. When the native oxide layer is removed by the process conditions, the deposition process may be performed at a temperature in range of about 490° C. to about 700° C. and a pressure of about 50 Torr to about 150 Torr.

Referring to FIG. 30, the first insulation layer 112 may be formed on the first silicon liner 310 by a deposition process. When the deposition process is performed, the first silicon liner 310 may be oxidized to reduce the thickness of the first silicon liner 310. Thus, the first silicon liner 310 may be transformed to the second silicon liner 310a. Further, the first insulation layer 112 may be formed on the second silicon liner 310a.

In this case, as the first silicon liner 310 is oxidized to a uniform thickness. Therefore, a thickness of the second silicon liner 310a formed on the sidewalls of the first active pattern 102 in the long axis direction and a thickness of the second silicon liner 310a formed on the sidewalls of the first active pattern 102 in the short axis direction may be different to each other. That is, a third thickness d3 of the second silicon liner 310a on the sidewall of the first active pattern 102 in the third direction may be less than a fourth thickness d4 of the second silicon liner 310a on the sidewall of the first active pattern 102 in the fourth direction.

Further, a thickness of the first insulation layer 112 may be greater than a thickness of the second silicon liner 310b.

Thereafter, the same processes illustrated with reference to FIGS. 16 to 24 may be performed. Therefore, an active region having a sufficient area in the fourth direction may be formed.

The semiconductor device may have a structure the same as a structure of semiconductor device illustrated with reference to FIGS. 23 and 24. However, in the second silicon liner 310a, the third thickness d3 of the second silicon liner 310a on the sidewall of the first active pattern 102 in the third direction may be less than a fourth thickness d4 of the second silicon liner on the sidewall of the first active pattern 102 in the fourth direction. Thus, the first active pattern 102 may have a sufficient area for forming the transistor and the first and second contact plugs 142 and 148.

FIGS. 31 to 35 are cross-sectional views illustrating stages of a method of manufacturing a semiconductor device in accordance with example embodiments.

The semiconductor device may be a fin field effect transistor.

Figure 31:
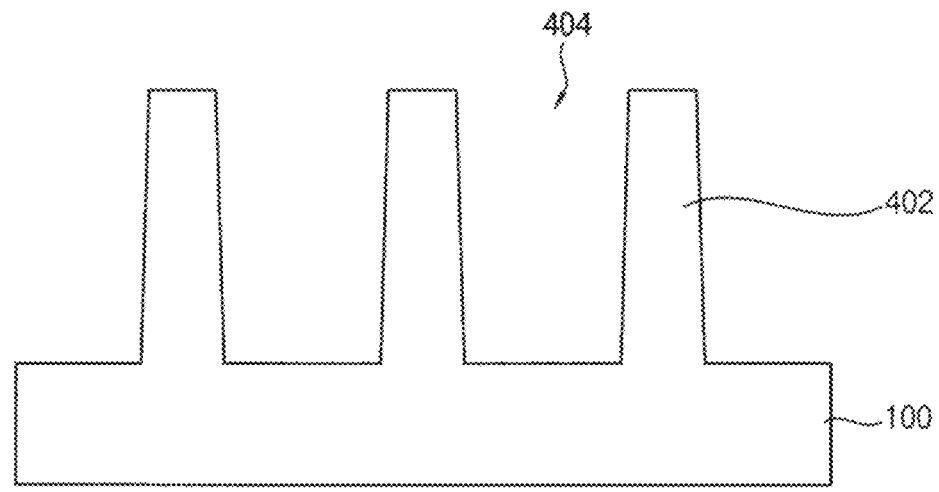

Referring to FIG. 31, a hard mask pattern (not shown) may be formed on the substrate 100, and the substrate 100 may be etched using the hard mask pattern as an etching mask to form first active patterns. The first active patterns 402 may be formed to protrude from the substrate 100.

In example embodiments, the first active patterns 402 may extend in the second direction. The first active patterns 402 may be spaced apart from each other in the first direction. The trench 404 may be formed between the first active patterns 402.

Figure 32:
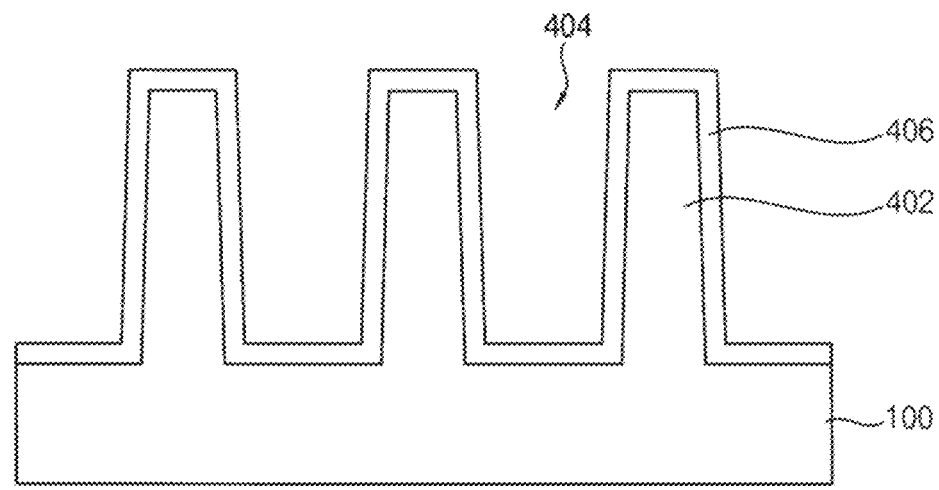

Referring to FIG. 32, the same processes illustrated with reference to FIGS. 4 to 10 may be performed on the first active pattern 402 and the substrate 100. Thus, the first silicon liner 406 may be formed on the surfaces of the first active patterns 402 and the substrate 100.

Figure 33:
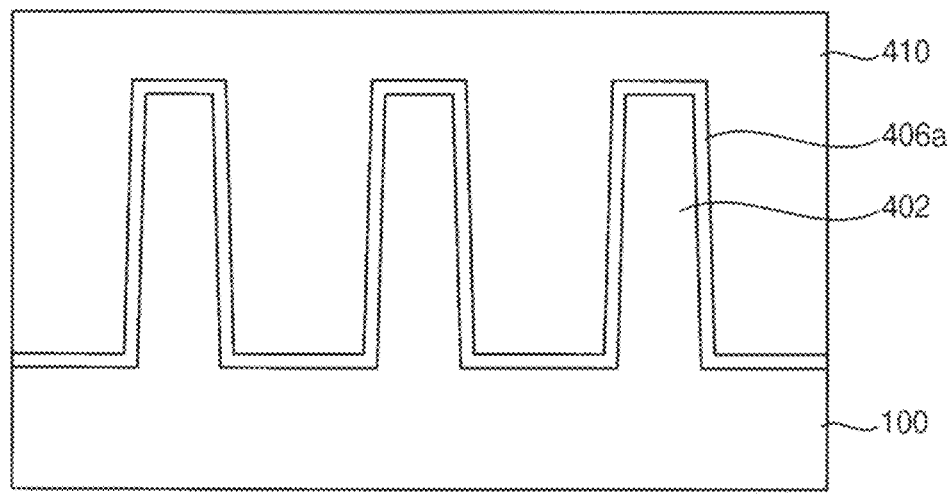

Referring to FIG. 33, the isolation layer may be formed on the first silicon liner 406 to sufficiently fill the trench 404 by a deposition process.

When the deposition process for forming the isolation layer 410 is performed, the surface of the first silicon liner 406 may be oxidized to reduce the thickness of the first silicon liner 406. Thus, the first silicon liner 406 may be transformed to the second silicon liner 406a. That is, the isolation layer 410 may be formed on the second silicon liner 406a.

The isolation layer 410 may include an oxide layer formed by oxidizing a surface of the first silicon liner 406 and an oxide layer formed by the deposition process. The oxide layers included in the isolation layer 410 may include substantially the same material, e.g., silicon oxide.

Figure 34:
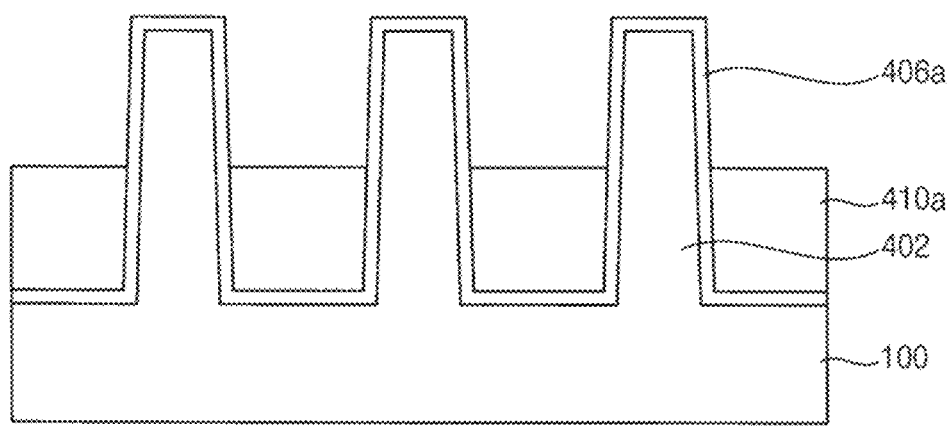

Referring to FIG. 34, the isolation layer 410 may be planarized until an upper surface of the second silicon liner 406a may be exposed. The planarization process may include a chemical mechanical polishing (CMP) process and/or an etch back process.

Then, a portion of the isolation layer 410 may be etched to expose the second silicon liner 406a formed on the upper sidewall of the first active pattern 402 to form the isolation pattern 410a. The isolation pattern 410a may fill a lower portion of the trench 404. That is, the second silicon liner 406a may be exposed on the isolation pattern 410a.

Figure 35:
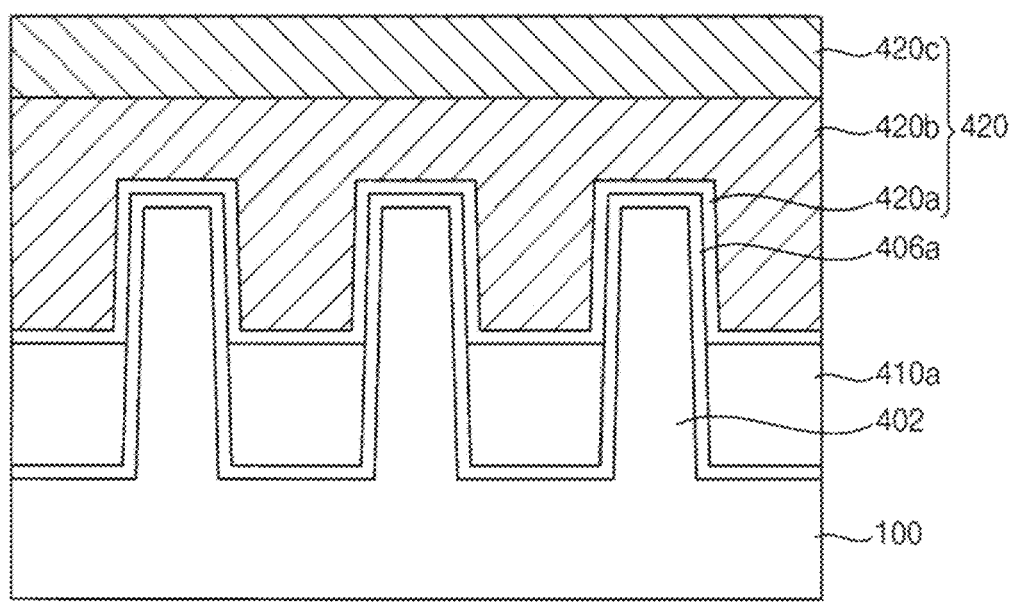

Referring to FIG. 35, a gate structure 420 is formed on the exposed surfaces of the second silicon liner 406a and the isolation pattern 410a. The gate structure 420 may include a gate insulation layer pattern 420a, a gate electrode 420b and a capping layer pattern 420c.

First and second impurity regions serving as a source/drain may be formed at the first active pattern 402 and the second silicon liner 406a adjacent to the both sides of the gate structure 420.

Although not illustrated, contact plugs contacting the first and second impurity regions and the gate electrode 420b may be formed, respectively.

The second silicon liner 406a may be formed, so that the area of the first active pattern 402 may not be reduced. Thus, an area for forming transistors and contact plugs may be sufficiently secured. In the semiconductor device, the gate insulation layer pattern 420a may be formed on the second silicon liner 406a. Thus, crystal defects included in the gate insulation layer pattern 420a may decrease, so that leakage currents of the transistor caused by the gate insulation layer pattern 420a may be decreased. Further, the reliability failure of the transistor can be decreased.

Figure 36:
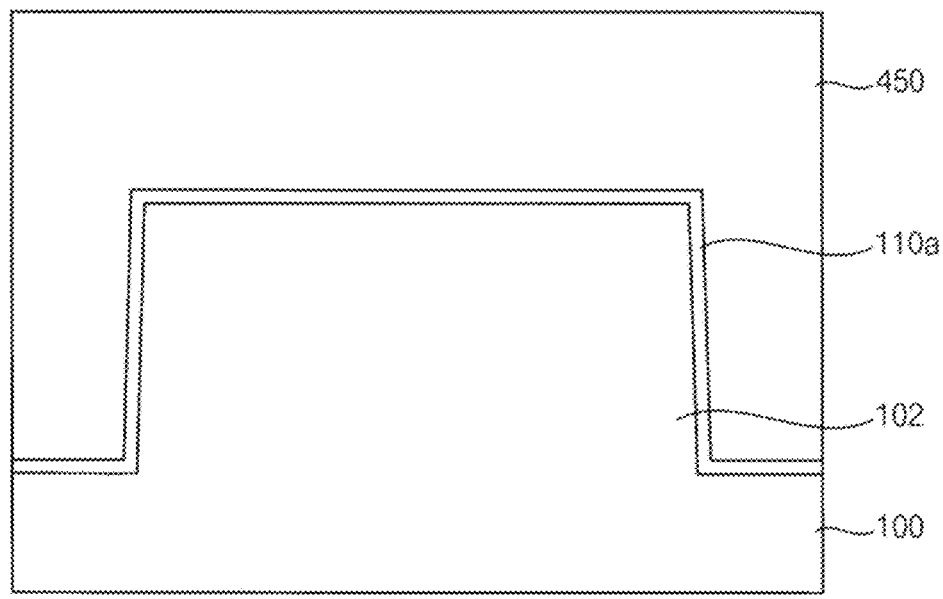
Figure 37:
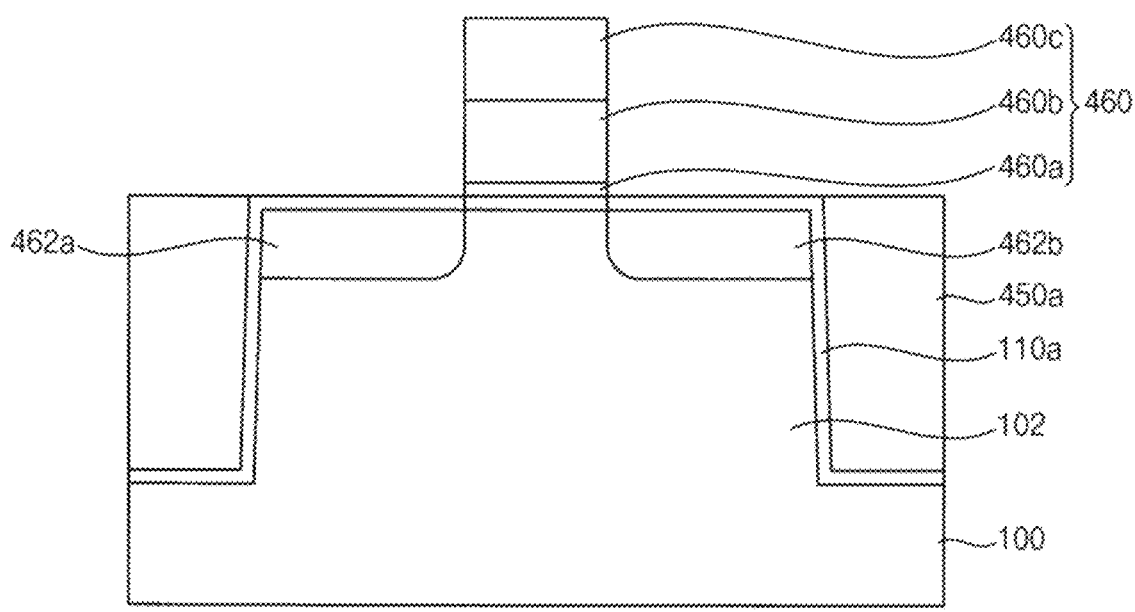

FIGS. 36 and 37 are cross-sectional views illustrating stages of a method of manufacturing a semiconductor device in accordance with example embodiments.

Referring to FIG. 36, a hard mask pattern (not shown) may be formed on the substrate 100, and the substrate 100 may be etched using the hard mask pattern as an etching mask to form first active patterns. The first active patterns 102 may protrude from the substrate 100. In example embodiments, the first active patterns 102 may be isolated to each other. A longitudinal direction of each of the first active patterns 102 may be the first direction.

Thereafter, the same processes illustrated with reference to FIGS. 4 to 10 may be performed. Thus, the first silicon liner may be formed on the surfaces of the first active patterns 102 and the substrate 100.

Subsequently, an isolation layer 450 may be formed on the first silicon liner to sufficiently fill the trench 404 by a deposition process. When the isolation layer 450 is formed, a thickness of the first silicon liner may be reduced by oxidizing a surface of the first silicon liner. Thus, the first silicon liner may be transformed to the second silicon liner 110a. The first isolation layer 450 may be formed on the second silicon liner 110a.

Referring to FIG. 37, the isolation layer 450 may be planarized until an upper surface of the second silicon liner 110a may be exposed. The planarization process may include a chemical mechanical polishing (CMP) process and/or an etch back process.

The gate structure 460 may be formed on the second silicon liner 110a. The gate structure 460 may include a gate insulation layer pattern 460a, a gate electrode 460b and a capping layer pattern 460c.

In example embodiments, the gate structure 460 may be formed on the second silicon liner 110a and the isolation layer 450a to cross the first active pattern 102.

The first and second impurity regions 462a and 462b serving as a source/drain may be formed at the second silicon liner 110a and the substrate 100 adjacent to the both sides of the gate structure 460. Although not shown, contact plugs may be formed to contact the first and second impurity regions 462a and 462b and the gate electrode 460b, respectively.

As such, a planar transistor may be formed on the second silicon liner 110*a*.

As described above, in example embodiments, the area of the active region may be sufficiently secured. Thus, the semiconductor device having excellent characteristics may be formed on the active region.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   etching a portion of a substrate to form an active pattern protruding from the substrate;
   conformally forming a first silicon liner having a crystalline structure on surfaces of the active pattern and the substrate;
   oxidizing a surface of the first silicon liner to form a second silicon liner and an insulation layer on the second silicon liner, the second silicon liner having a thickness less than a thickness of the first silicon liner, the second silicon liner and the insulation layer conformally along top and side surfaces of the active pattern;
   forming an isolation layer on the insulation layer to fill a trench adjacent to the active pattern; and,
   forming a transistor, the transistor including
      a gate structure disposed on the second silicon liner, and
      impurity regions, the impurity regions adjacent to respective sides of the gate structure.

2. The method of claim 1, before forming the first silicon liner, further comprising removing a native oxide layer formed on surfaces of the active pattern and the substrate.

3. The method of claim 2, wherein the removing the native oxide layer and the forming the first silicon liner are performed in situ.

4. The method of claim 2, wherein the removing the native oxide layer comprises:
   performing a first process of introducing an etching source gas onto surfaces of the active pattern and the substrate; and
   performing a second process of applying heat and pressure on the active pattern and the substrate surface.

5. The method of claim 4, wherein
   the first process is performed in a first etching chamber, and
   the second process is performed in a second etching chamber different from the first etching chamber.

6. The method of claim 4, wherein the etching source gas includes Ar, $NH_3$, $NF_3$, or a combination thereof.

7. The method of claim 4, wherein forming the first silicon liner is performed at a pressure of 50 Torr to 500 Torr and a temperature of 450° C. to 800° C.

8. The method of claim 4, wherein in the forming the first silicon liner, a silicon source gas includes monosilane, disilane, dichlorosilane (DCS), or a combination thereof.

9. The method of claim 1, wherein
   the forming the first silicon liner is performed in a deposition chamber having a volume of 20 L or less, and
   nitrogen gas is introduced into the deposition chamber to have a flow rate of 100 sccm to 10,000 sccm.

10. The method of claim 1, wherein the second silicon liner has a thickness less than a thickness of the insulation layer.

11. The method of claim 1, further comprising:
    etching portions of the active pattern, the second silicon liner and the isolation layer to form a gate trench extending in a first direction; and
    forming the gate structure in the gate trench.

12. The method of claim 11, wherein the active pattern and the second silicon liner are exposed by the gate trench, and a portion of the gate structure contacts the second silicon liner exposed by the gate trench.

13. The method of claim 1, wherein
    the second silicon liner is formed on the active pattern, and
    the substrate is formed to have a uniform thickness.

14. The method of claim 1, wherein
    the active pattern is isolated from adjacent active patterns and extends in one direction,
    the active pattern has a length in a long axis direction greater than a length in a short axis direction perpendicular to the long axis direction, and
    a first thickness of the second silicon liner on a sidewall of the active pattern in the long axis direction is greater than a second thickness of a second silicon liner on a sidewall of the active pattern in the short axis direction.

15. The method of claim 1, wherein
    the active pattern is isolated from adjacent active patterns and extends in one direction,
    the active pattern has a length in a long axis direction greater than a length in a short axis direction perpendicular to the long axis direction, and
    a first thickness of the second silicon liner on a sidewall of the active pattern in the long axis direction is less than a second thickness of the second silicon liner on a sidewall of the active pattern in the short axis direction.

* * * * *